(12) United States Patent
Tel et al.

(10) Patent No.: US 10,571,806 B2
(45) Date of Patent: Feb. 25, 2020

(54) METHOD AND SYSTEM TO MONITOR A PROCESS APPARATUS

(71) Applicant: ASML NETHERLANDS B.V., Veldhoven (NL)

(72) Inventors: Wim Tjibbo Tel, Helmond (NL); Mark John Maslow, Eindhoven (NL); Frank Staals, Eindhoven (NL); Paul Christiaan Hinnen, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/327,363

(22) PCT Filed: Aug. 3, 2017

(86) PCT No.: PCT/EP2017/069669
§ 371 (c)(1),
(2) Date: Feb. 22, 2019

(87) PCT Pub. No.: WO2018/041513
PCT Pub. Date: Mar. 8, 2018

(65) Prior Publication Data
US 2019/0196334 A1 Jun. 27, 2019

(30) Foreign Application Priority Data
Sep. 2, 2016 (EP) .................................... 16187040

(51) Int. Cl.
*G03F 7/20* (2006.01)
(52) U.S. Cl.
CPC ........ *G03F 7/2043* (2013.01); *G03F 7/70616* (2013.01)

(58) Field of Classification Search
CPC ............. G03F 7/70641; G03F 7/70683; G03F 9/7092; G03F 7/70516; G03F 7/70625;
(Continued)

(56) References Cited

U.S. PATENT DOCUMENTS 9,952,517 B2 * 4/2018 Verma ................ G01N 21/4738
10,359,705 B2 * 7/2019 Wang .................. G03F 7/70641
(Continued)

FOREIGN PATENT DOCUMENTS

| EP | 1881374 A2 | 1/2008 |
|---|---|---|
| TW | 200938976 | 9/2009 |

(Continued)

OTHER PUBLICATIONS

International Search Report and Written Opinion issued in corresponding PCT Patent Application No. PCT/EP2017/069669, dated Oct. 9, 2017.
(Continued)

*Primary Examiner* — Deoram Persaud
(74) *Attorney, Agent, or Firm* — Pillsbury Winthrop Shaw Pittman LLP

(57) ABSTRACT

A method involving determining a contribution that one or more process apparatuses make to a characteristic of a substrate after the substrate has been processed according to a patterning process by the one or more process apparatuses by removing from values of the characteristic of the substrate a contribution of a lithography apparatus to the characteristic and a contribution of one or more pre-lithography process apparatuses to the characteristic.

22 Claims, 15 Drawing Sheets

(58) Field of Classification Search
CPC .. G06F 17/10; G06F 17/5018; G06F 17/5081; G06F 19/00; G06F 2217/12; G06F 2217/14; G06F 2217/16; H01L 22/12; H01L 22/20
See application file for complete search history.

(56) References Cited

U.S. PATENT DOCUMENTS

| | | |
|---|---|---|
| 2005/0185174 A1 | 8/2005 | Laan et al. |
| 2006/0066855 A1 | 3/2006 | Boef et al. |
| 2010/0161099 A1 | 6/2010 | Mos et al. |
| 2011/0027704 A1 | 2/2011 | Cramer et al. |
| 2011/0043791 A1 | 2/2011 | Smilde et al. |
| 2011/0295555 A1* | 12/2011 | Meessen ............. G03F 7/705 702/179 |
| 2012/0242970 A1 | 9/2012 | Smilde et al. |
| 2013/0080984 A1 | 3/2013 | Liu et al. |
| 2016/0116849 A1* | 4/2016 | Cramer ............ G03F 7/70625 355/67 |
| 2016/0370717 A1* | 12/2016 | Den Boef .......... G03F 7/70633 |
| 2017/0109646 A1* | 4/2017 | David ................ G03F 7/705 |

FOREIGN PATENT DOCUMENTS

| | | |
|---|---|---|
| TW | 201423842 | 6/2014 |
| TW | I1459169 | 11/2014 |
| TW | 201539116 | 10/2015 |
| WO | 2009078708 | 6/2009 |
| WO | 2009106279 | 9/2009 |
| WO | 2010037472 | 4/2010 |
| WO | 2016096668 | 6/2016 |

OTHER PUBLICATIONS

Taiwanese Office Action issued in corresponding Taiwanese Patent Application No. 106128022, dated May 18, 2018.

Taiwanese Office Action issued in corresponding Taiwanese Patent Application No. 107147685, dated Aug. 27, 2019.

* cited by examiner

METHOD AND SYSTEM TO MONITOR A PROCESS APPARATUS

CROSS-REFERENCE TO RELATED APPLICATIONS

This application is the U.S. national phase entry of PCT patent application no. PCT/EP2017/069669, which was filed on Aug. 3, 2017, which claims the benefit of priority of European patent application no. 16187040.7, which was filed on Sep. 2, 2016, and which is incorporated herein in its entirety by reference.

FIELD

The present description relates to a method and system for monitoring and/or adjusting one or more substrate manufacturing variables related to the processing of a substrate.

BACKGROUND

A lithographic apparatus is a machine that applies a desired pattern onto a substrate, usually onto a target portion of the substrate. A lithographic apparatus can be used, for example, in the manufacture of integrated circuits (ICs) or other devices designed to be functional. In that instance, a patterning device, which is alternatively referred to as a mask or a reticle, may be used to generate a circuit pattern to be formed on an individual layer of the device designed to be functional. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

SUMMARY

Manufacturing devices, such as semiconductor devices, typically involves processing a substrate (e.g., a semiconductor wafer) using a number of fabrication processes to form various features and often multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching using the pattern by an etch apparatus, etc. Further, one or more metrology processes are involved in the patterning process.

Metrology processes are used at various steps during a patterning process to monitor and/or control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), one or more variables of the patterning process may be altered, e.g., based on the measurements of the one or more characteristics, such that further substrates manufactured by the patterning process have an acceptable characteristic(s).

With the advancement of lithography and other patterning process technologies, the dimensions of functional elements have continually been reduced while the amount of the functional elements, such as transistors, per device has been steadily increased over decades. In the meanwhile, the requirement of accuracy in terms of overlay, critical dimension (CD), etc. has become more and more stringent. Error, such as overlay error, CD error, etc., will inevitably be produced in the patterning process. For example, imaging error may be produced from optical aberration, patterning device heating, patterning device error, and/or substrate heating and can be characterized in terms of, e.g., overlay error, CD error, etc. Additionally or alternatively, error may be introduced in other parts of the patterning process, such as in etch, development, bake, etc. and similarly can be characterized in terms of, e.g., overlay error, CD error, etc. The error may directly cause a problem in terms of the functioning of the device, including failure of the device to function or one or more electrical problems of the functioning device.

A lithography baseliner system may be used to monitor the performance of a lithographic apparatus over time. When performance of the lithographic apparatus deviates from an acceptable standard, an action can be taken, such as re-calibration, repair, shutdown, etc. Further, the lithographic baseliner system can enable timely control of the lithographic apparatus by, for example, modifying one or more settings (variables) of the lithographic apparatus. Thus, a lithography baseliner system can enable, e.g., stable performance in high volume manufacturing (HVM).

The lithography baseliner system can effectively aim to keep the lithographic apparatus to a certain baseline. To do this, in an embodiment, the lithography baseliner system obtains measurements taken on a monitor wafer using a metrology apparatus (such as a diffraction based optical measurement tool). In an embodiment, the monitor wafer can be exposed using a certain patterning device pattern comprising marks suitable for the metrology apparatus. From the measurements, the lithography baseliner system determines how far the lithographic apparatus has drifted from its baseline. In an embodiment, the lithography baseliner system then calculates, e.g., substrate-level overlay and/or focus correction sets. The lithographic apparatus then uses these correction sets to make specific corrections for exposure of subsequent production wafers.

A similar baseliner is desirable for a non-lithography process apparatus, for example, an etch tool, a deposition tool, etc. Therefore, it is desirable to provide a method and/or an apparatus that can better monitor and/or control the performance of one or more non-lithographic process apparatuses.

In an embodiment, there is provided a method comprising: determining, by a hardware computer system, a contribution that one or more process apparatuses make to a characteristic of a substrate after the substrate has been processed according to a patterning process by the one or more process apparatuses by removing from values of the characteristic of the substrate a contribution of a lithography apparatus to the characteristic and a contribution of one or more pre-lithography process apparatuses to the characteristic.

In an embodiment, there is provided a method, comprising: estimating, by a hardware computer system, a characteristic that will be imparted to a substrate to be processed by a patterning process by combining a contribution specific to the substrate of a first group of one or more process variables related to one or more process apparatuses used in the patterning process and a contribution non-specific to the substrate of a second group of one or more process variables related to the one or more process apparatuses, at least one process variable from the first group and/or the second group being related to a process apparatus upstream from a lithographic apparatus.

In an embodiment, there is provided a method, comprising: estimating, by a hardware computer system, a characteristic that will be imparted to a substrate to be processed by one or more process apparatuses by combining one or more contributions to the characteristic of the one or more process apparatuses with one or more values of the characteristic, at least one of the one or more process apparatuses being upstream from a lithographic apparatus.

In an embodiment, there is provided a method, comprising: determining one or more contributions of one or more first process apparatuses to a characteristic of a substrate; and creating, by a hardware computer system and based at least in part on the one or more contributions, modification information to adjust one or more second process apparatuses downstream from the one or more first process apparatuses.

In an embodiment, there is provided a non-transitory computer program product comprising machine-readable instructions for causing a processor system to cause performance of a method described herein.

In an embodiment, there is provided a system comprising: a hardware processor system; and a non-transitory computer readable storage medium configured to store machine-readable instructions, wherein when executed, the machine-readable instructions cause the hardware processor system to perform a method as described herein.

BRIEF DESCRIPTION OF THE DRAWINGS

Embodiments will now be described, by way of example only, with reference to the accompanying drawings in which.

DETAILED DESCRIPTION

Before describing embodiments in detail, it is instructive to present an example environment in which embodiments may be implemented.

Figure 1:
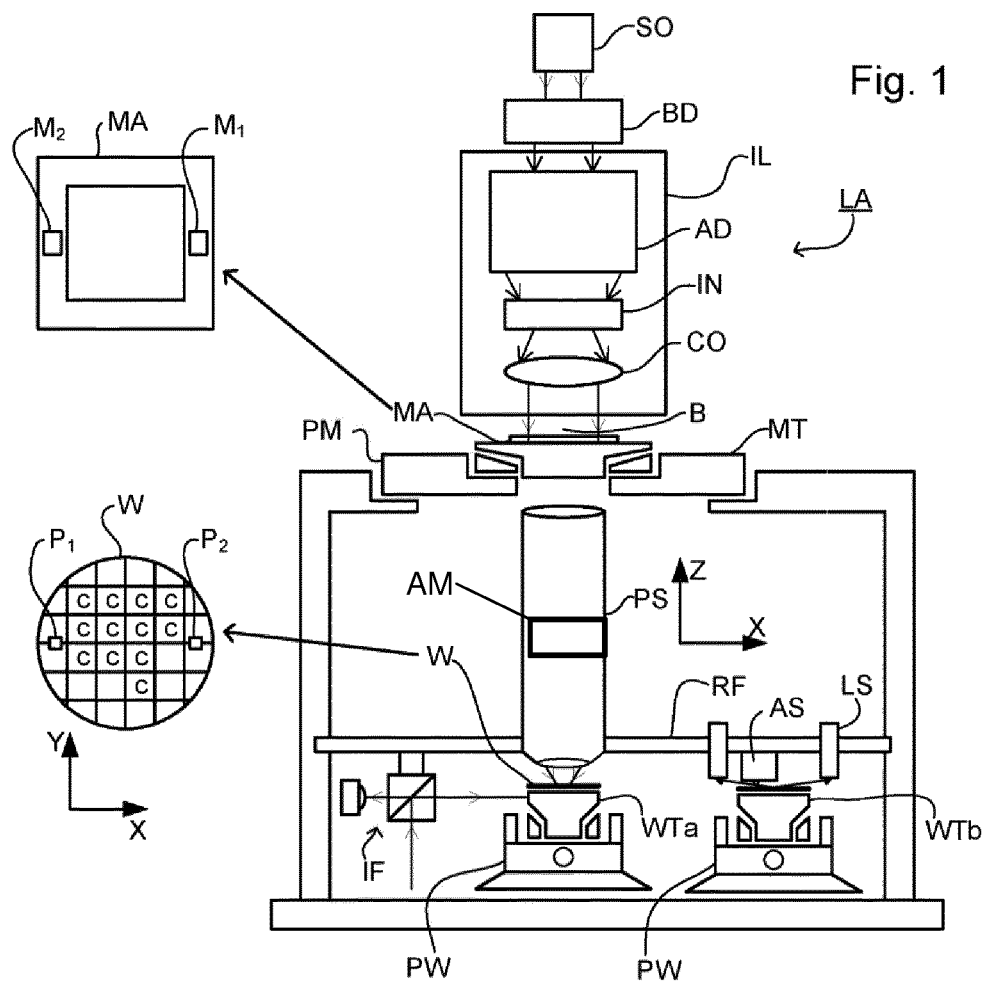
FIG. 1 schematically depicts an embodiment of a lithographic apparatus.

FIG. 1 schematically depicts a lithographic apparatus LA. The apparatus comprises:
  an illumination system (illuminator) IL configured to condition a radiation beam B (e.g. UV radiation or DUV radiation);
  a support structure (e.g. a mask table) MT constructed to support a patterning device (e.g. a mask) MA and connected to a first positioner PM configured to accurately position the patterning device in accordance with certain parameters;
  a substrate table (e.g. a wafer table) WT constructed to hold a substrate (e.g. a resist-coated wafer) W and connected to a second positioner PW configured to accurately position the substrate in accordance with certain parameters; and
  a projection system (e.g. a refractive projection lens system) PS configured to project a pattern imparted to the radiation beam B by patterning device MA onto a target portion C (e.g. comprising one or more dies) of the substrate W, the projection system supported on a reference frame (RF).

The illumination system may include various types of optical components, such as refractive, reflective, magnetic, electromagnetic, electrostatic or other types of optical components, or any combination thereof, for directing, shaping, or controlling radiation.

The support structure supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithographic apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a coordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithographic apparatus LA. Using a computational lithography technique, the patterning device MA may be designed to at least partially correct for apodization.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
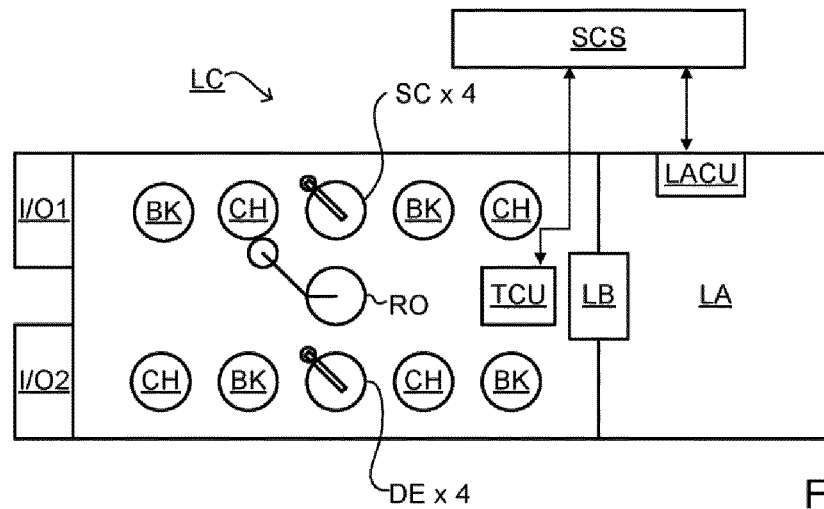
FIG. 2 schematically depicts an embodiment of a lithographic cell or cluster.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently, it is desirable to inspect an exposed substrate to measure one or more properties such as overlay error between subsequent layers, line thickness, critical dimension (CD), focus offset, a material property, etc. Accordingly a manufacturing facility in which lithocell LC is located also typically includes a metrology system MET which receives some or all of the substrates W that have been processed in the lithocell. The metrology system MET may be part of the lithocell LC, for example it may be part of the lithographic apparatus LA.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, an inspection apparatus is used to determine one or more properties of the substrate, and in particular, how one or more properties of different substrates vary or different layers of the same substrate vary from layer to layer. The inspection apparatus may be integrated into the lithographic apparatus LA or the lithocell LC or may be a stand-alone device. To enable rapid measurement, it is desirable that the inspection apparatus measure one or more properties in the exposed resist layer immediately after the exposure. However, the latent image in the resist has a low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of a faulty substrate but may still provide useful information.

To enable the metrology, one or more targets can be provided on the substrate. In an embodiment, the target is specially designed and may comprise a periodic structure. In an embodiment, the target is a part of a device pattern, e.g., a periodic structure of the device pattern. A target used can comprise a relatively large periodic structure layout (e.g., comprising one or more gratings), e.g., 40 µm by 40 µm. In that case, the measurement beam often has a spot size that is smaller than the periodic structure layout (i.e., the layout is underfilled such that one or more of the periodic structures is not completely covered by the spot). This simplifies mathematical reconstruction of the target as it can be regarded as infinite. However, for example, so the target can be positioned in among product features, rather than in the scribe lane, the size of a target has been reduced, e.g., to 20 µm by 20 µm or less, or to 10 µm by 10 µm or less. In this situation, the periodic structure layout may be made smaller than the measurement spot (i.e., the periodic structure layout is overfilled). Typically such a target is measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by product structures on a substrate. In an embodiment, multiple targets can be measured in one image.

In an embodiment, the target on a substrate may comprise one or more 1-D periodic gratings, which are printed such that after development, the bars are formed of solid resist lines. In an embodiment, the target may comprise one or more 2-D periodic gratings, which are printed such that after development, the one or more gratings are formed of solid resist pillars or vias in the resist. The bars, pillars or vias may alternatively be etched into or on the substrate (e.g., into one or more layers on the substrate).

In an embodiment, the pattern (e.g., of bars, pillars or vias) of the target is sensitive to one or more processing characteristics (e.g., optical aberration in the lithographic projection apparatus (particularly the projection system PS), focus change, dose change, etc.) of the patterning process and the presence of such characteristics will manifest themselves in a variation in the printed pattern. Accordingly, the measured data of the printed target can be used to reconstruct the pattern and one or more of the characteristics. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

Figure 3:
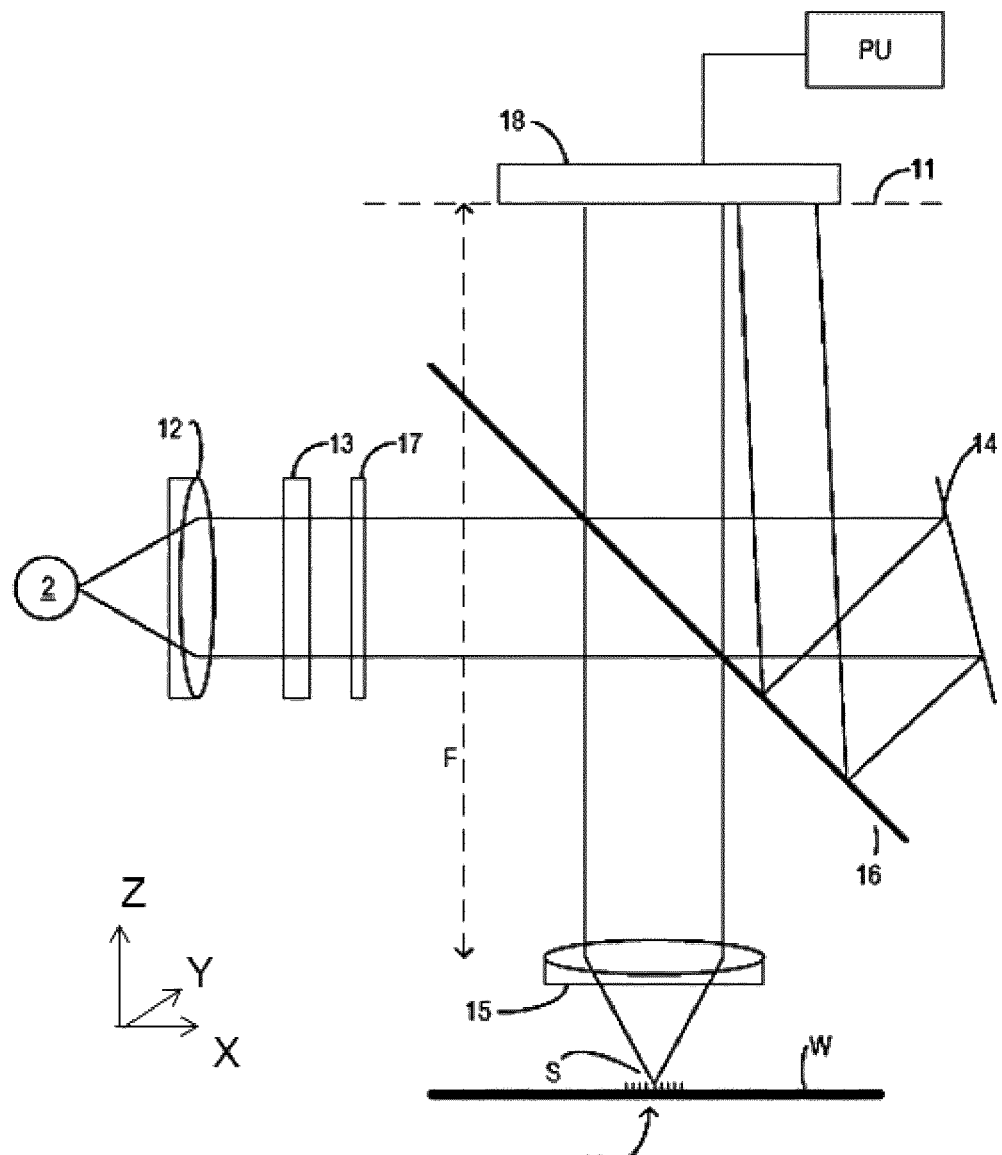
FIG. 3 schematically depicts an example inspection apparatus.

FIG. 3 depicts an example inspection apparatus (e.g., a scatterometer). The inspection apparatus may be a stand-alone device or incorporated in either the lithographic apparatus LA, e.g., at the measurement station, or the lithographic cell LC.

It comprises a radiation projector (e.g., a broadband white light projector or projector of various wavelengths in the visible and/or near infrared) which projects radiation onto a substrate W. In this device, the radiation emitted by a radiation source 2 is collimated using lens system 12 and transmitted through interference filter 13 and polarizer 17, reflected by partially reflecting surface 16 and is focused into a spot S on substrate W via an objective lens 15, which has a high numerical aperture (NA), desirably at least 0.9 or at least 0.95. An immersion inspection apparatus (using a relatively high refractive index fluid such as water) may even have a numerical aperture over 1.

The radiation redirected by the substrate W then passes through partially reflecting surface 16 into a detector 18 (e.g., a spectrometer detector) in order to have the redirected radiation detected. The detector 18 may be located at a back-projected focal plane 11 (i.e., at the focal length of the lens system 15) or the plane 11 may be re-imaged with auxiliary optics (not shown) onto the detector 18. The detector may be a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 13 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 18 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation. In an embodiment, a spectrum (intensity as a function of wavelength) of the specular reflected radiation is measured.

From this data, the structure or profile giving rise to the detected intensity, spectrum, etc. may be reconstructed by processor PU, e.g. by Rigorous Coupled Wave Analysis and non-linear regression or by comparison with a library of simulated spectra, intensity distributions, etc. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

As in the lithographic apparatus LA, one or more substrate tables may be provided to hold the substrate W during measurement operations. The substrate tables may be similar or identical in form to the substrate table WT of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 15. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

In addition to measurement of a parameter by reconstruction, a particular application of this diffraction-based metrology or inspection is in the measurement of feature asymmetry within a periodic target. For example, angle resolved scatterometry is useful in the measurement of asymmetry of features in product and/or resist patterns. A particular application of asymmetry measurement is for the measurement of overlay error, where the target 30 comprises one set of periodic features superimposed on another. The concepts of asymmetry measurement using the instrument of FIG. 3 is described, for example, in U.S. patent application publication US2006-066855, which is incorporated herein in its entirety. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 3, where detector 18 may be an image sensor, such asymmetry in the diffraction orders appears directly as asymmetry in the pupil image recorded by detector 18. This asymmetry can be measured by digital image processing in unit PU, and calibrated against known values of overlay. For example, asymmetry can be measured by comparing opposite parts of the diffraction spectrum (for example, comparing the −1st and +1$^{st}$ orders in the diffraction spectrum of a periodic grating).

Figure 4:
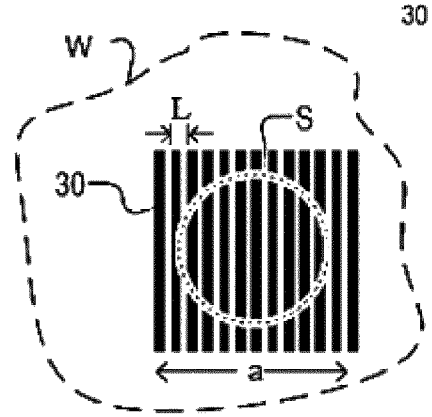
FIG. 4 illustrates the relationship between an illumination spot of an inspection apparatus and a metrology target.

FIG. 4 illustrates a plan view of a typical target 30, and the extent of illumination spot S in the apparatus of FIG. 3. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 13, 17 may be configured to provide illumination of a uniform intensity across a back focal plane of objective 15. Alternatively, by, e.g., including an aperture in the illumination path, illumination may be restricted to on axis or off axis directions.

In an embodiment, the target may be a composite metrology target formed on a substrate. In an embodiment, the composite target comprises four periodic structures (in this case, gratings) positioned closely together. In an embodiment, the periodic structures are positioned closely together enough so that they all are within a measurement spot formed by the illumination beam of the metrology apparatus. In that case, the four periodic structures thus are all simultaneously illuminated and simultaneously measured. In an embodiment, the 2 of the 4 periodic structures have their elongate features (e.g., lines) extend in a first direction (e.g., X direction) and another 2 of the 4 periodic structures have their elongate features (e.g., lines) extend in a first direction (e.g., Y direction). In an example dedicated to overlay measurement, periodic structures are themselves composite periodic structures (e.g., composite gratings) formed by overlying periodic structures, i.e., periodic structures are patterned in different layers of the device formed on the substrate and such that at least one periodic structure in one layer overlays at least one periodic structure in a different layer. Such a target may have outer dimensions within 20 μm×20 μm or within 16 μm×16 μm. Further, all the periodic structures are used to measure overlay between a particular pair of layers.

To facilitate a target being able to measure more than a single pair of layers, periodic structures may have differently biased overlay offsets in order to facilitate measurement of overlay between different layers in which the different parts of the composite periodic structures are formed. Thus, for example, all the periodic structures for the target on the substrate would be used to measure one pair of layers and all the periodic structures for another same target on the substrate would be used to measure another pair of layers, wherein the different bias facilitates distinguishing between the layer pairs. In one example, two periodic structures are X-direction periodic structures with biases of +d, –d, respectively. Another two periodic structures may be Y-direction periodic structures with offsets +d and –d respectively. While four periodic structures are illustrated, another embodiment may include a larger matrix to obtain desired accuracy. For example, a 3×3 array of nine composite periodic structures may have biases –4d, –3d, –2d, –d, 0, +d, +2d, +3d, +4d. Separate images of these periodic structures can be identified in the image captured by the sensor.

Figure 5:
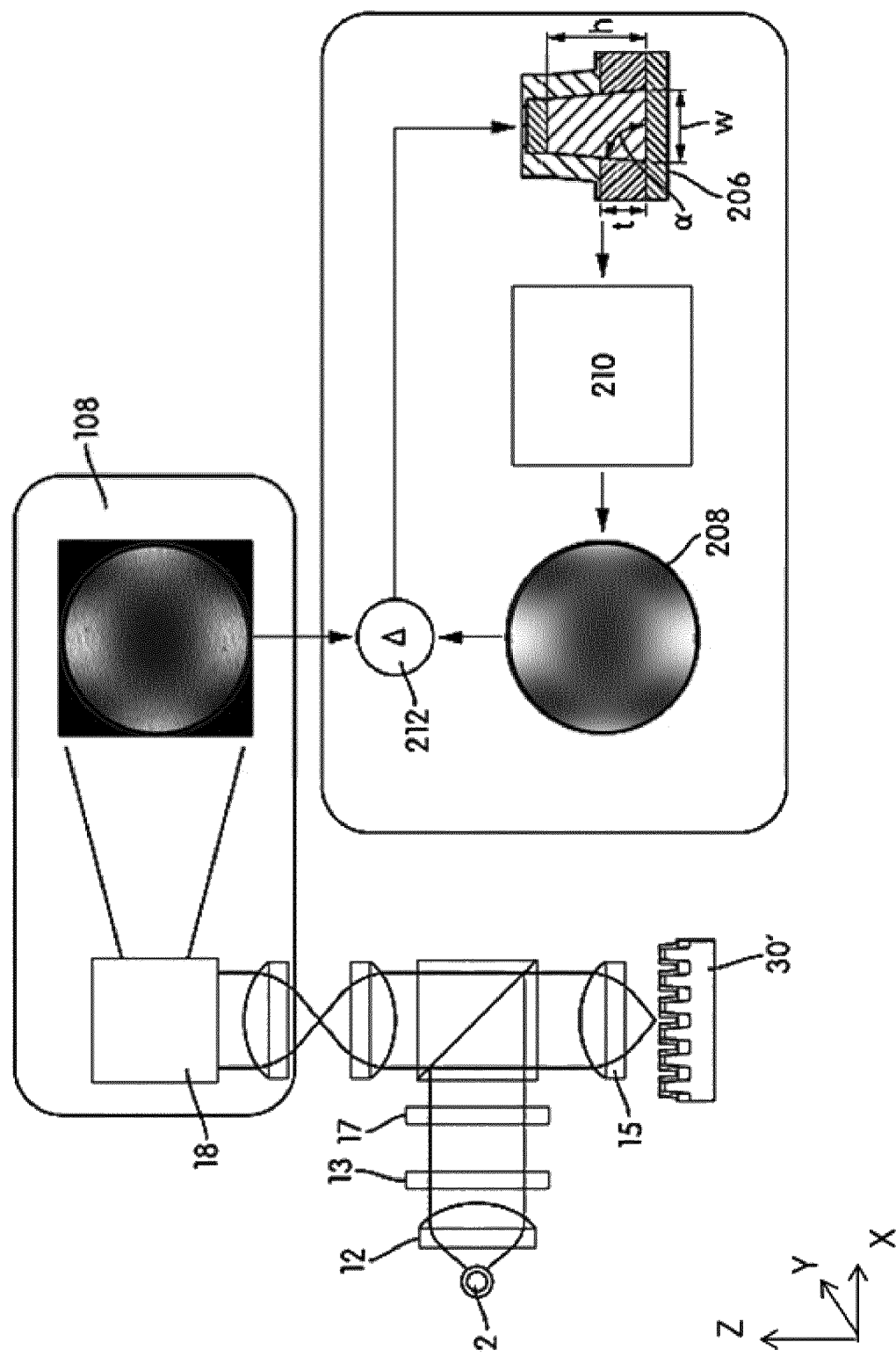
FIG. 5 schematically depicts a process of deriving one or more variables of interest based on measurement data.

FIG. 5 schematically depicts an example process of the determination of the value of one or more variables of interest of a target pattern 30' based on measurement data obtained using metrology. Radiation detected by the detector 18 provides a measured radiation distribution 108 for target 30'.

For a given target 30', a radiation distribution 208 can be computed/simulated from a parameterized model 206 using, for example, a numerical Maxwell solver 210. The parameterized model 206 shows example layers of various materials making up, and associated with, the target. The parameterized model 206 may include one or more of variables for the features and layers of the portion of the target under consideration, which may be varied and derived. As shown in FIG. 5, the one or more of the variables may include the thickness t of one or more layers, a width w (e.g., CD) of one or more features, a height h of one or more features, and/or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 108 is then compared at 212 to the computed radiation distribution 208 to determine the difference between the two. If there is a difference, the values of one or more of the variables of the parameterized model 206 may be varied, a new computed radiation distribution 208 calculated and compared against the measured radiation distribution 108 until there is sufficient match between the measured radiation distribution 108 and the computed radiation distribution 208. At that point, the values of the variables of the parameterized model 206 provide a good or best match of the geometry of the actual target 30'. In an embodiment, there is sufficient match when a difference between the measured radiation distribution 108 and the computed radiation distribution 208 is within a tolerance threshold.

The measurement accuracy and/or sensitivity of the target may vary with respect to one or more characteristics of the beam of radiation provided onto the target, for example, the wavelength of the radiation beam, the polarization of the radiation beam, and/or the intensity distribution (i.e., angular or spatial intensity distribution) of the radiation beam. In an embodiment, the wavelength range of the radiation beam is limited to one or more wavelengths selected from a range (e.g., selected from the range of about 400 nm to 900 nm). Further, a selection of different polarizations of the radiation beam may be provided and various illumination shapes can be provided using, for example, a plurality of different apertures.

In order to monitor the patterning process (e.g., a device manufacturing process) that includes at least one patterning step (e.g., an optical lithography step), the patterned substrate is inspected and one or more parameters of the patterned substrate are measured. The one or more parameters may include, for example, overlay error between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate.

There are various techniques for making measurements of the structures formed in the patterning process, including the use of an electron beam inspection (e.g., a scanning electron microscope), image-based measurement or inspection tools and/or various specialized tools. As discussed above, a fast and non-invasive form of specialized metrology and/or inspection tool is one in which a beam of radiation is directed onto a target on the surface of the substrate and properties of the scattered (diffracted/reflected) beam are measured. By evaluating those properties of the beam after it has been scattered by the substrate, one or more properties of the substrate can be determined. This may be termed diffraction-based metrology or inspection.

Significant aspects to enabling a patterning process include developing the process itself, setting it up for monitoring and control and then actually monitoring and controlling the process itself. Assuming a configuration of the fundamentals of the patterning process, such as the patterning device pattern(s), the resist type(s), post-lithography process steps (such as the development, etch, etc.), it is desirable to setup the apparatus in the patterning process for transferring the pattern onto the substrates, develop one or more metrology targets to monitor the process, setup up a metrology process to measure the metrology targets and then implement a process of monitoring and/or controlling the process based on measurements.

One or more portions of the design layout may be identified, which are referred to as critical features or hot spots. In an embodiment, a set of critical features or hot spots is extracted, which represents the complicated patterns in the design layout (e.g., about 50 to 1000 critical features or hot spots, although any number of critical features or hot spots may be used). As will be appreciated by those skilled in the art, these critical features or hot spots represent small portions (i.e. circuits, cells, patterns or design clips) of the design and especially the critical features or hot spots represent small portions for which particular attention and/or verification is needed. The critical features or hot spots may be identified by experience (including critical features or hot spots provided by a user), by trial and error, or by running a full-chip simulation. In an embodiment, the hot spots define a boundary of a process window (e.g., a dose and focus process window within which exposed features have a critical dimension value within a tolerance range (e.g., ±5%, ±10)) for a patterning process.

In an embodiment, there is provided a monitoring and/or control system that monitors and/or controls the performance of a process apparatus (e.g., an etch tool, or a deposition tool, or a chemical mechanical planarization tool, etc.) upstream or downstream of a lithography apparatus based on a characteristic determined from one or more patterned substrates (e.g., a production substrate, a monitor substrate, etc.).

More particularly, for example, in an embodiment, the performance of an etch tool can be determined by analyzing a finally etched substrate, determining an overall variability thereof from a target substrate, and determining the contribution of the etch tool to that overall variability. This can be done, for example, by factoring out the variability attributable to one or more other process apparatuses that also contribute to the overall variability. For example, the contribution of a lithographic apparatus and a deposition tool to the overall variability, e.g., deviation from a target or designed substrate and/or pattern configuration, or characteristics of a pattern on the finally etched substrate and/or of the finally etched substrate, can be subtracted from the overall variability to determine the contribution of the etch tool to the overall variability. The overall variability here may be considered to be, for example, a fingerprint (e.g., a spatial distribution of variance of a characteristic) of the pattern and/or of the finally etched substrate. This is explained in more detail below.

Further, while this example refers to performance of an etch tool, one or more other non-lithographic apparatuses can be similarly evaluated. The results from a measurement of a finally etched substrate can be analyzed to factor out the variability attributable to one or more other process apparatuses that also contribute to the overall variability to yield the contribution to the variability attributable to the non-lithographic process apparatus under consideration.

Figure 6:
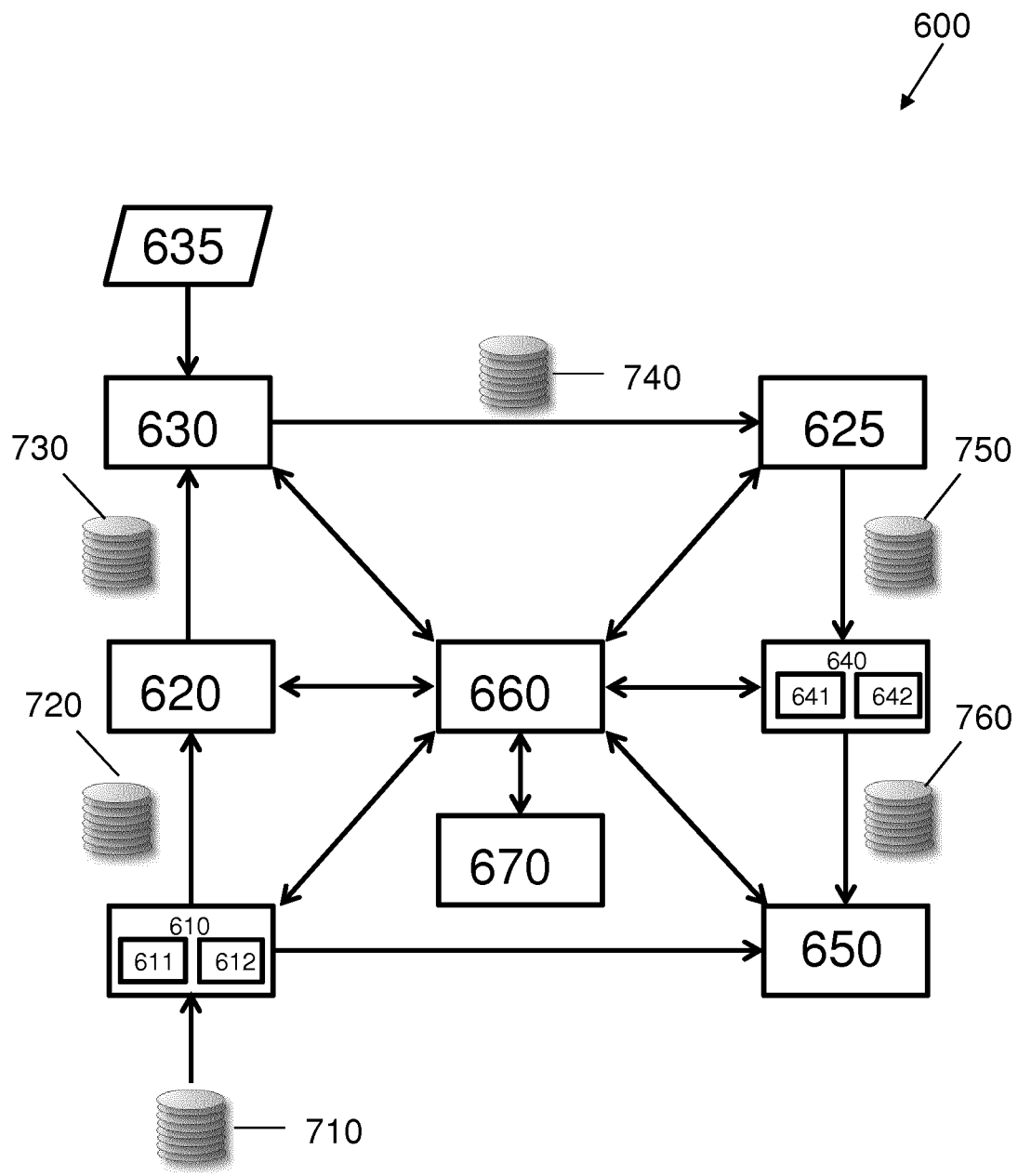
FIG. 6 schematically depicts an embodiment of a process apparatus baseliner system.

Referring to FIG. 6, an example process apparatus baseliner system 600 is schematically shown in an example manufacturing environment. The manufacturing environment comprises a deposition tool 610, a first component 620 of a track (such as a resist coating component of a track), a lithographic apparatus 630 (which uses a patterning device 635), a second component 625 of a track (such as a development component of the track and/or a bake plate component of the track), an etch tool 640, and one or more metrology apparatuses 650 (which can be stand-alone or integrated into one or more of the other apparatuses as discussed below). In an embodiment, the deposition tool 610 and the first track component 620 are referred to as pre-lithography process apparatuses. In an embodiment, the second track component 625 and the etch tool 640 are referred to as post-lithography process apparatuses. In an embodiment, the manufacturing environment may comprise one or more additional pre-lithography process apparatuses and/or one or more additional post-lithography process apparatuses (e.g., a chemical mechanical planarization tool, another deposition tool, etc.) The deposition tool 610 may be an atomic layer deposition (ALD), a chemical vapor deposition (CVD) and/or a physical vapor deposition (PVD) tool. While the first track component 620 and the second track component 625 are often part of a same track, they can be separated into different devices or tracks.

As will be appreciated, the manufacturing environment need not have all the apparatuses depicted. Further, one or more of the apparatuses may be combined into one. For example, the metrology apparatus 650 may be part of one or more of the pre-lithography process apparatuses (e.g., the deposition tool 610, and/or the first track component 620, etc.), the lithographic apparatus 630, and/or part of one or more of the post-lithography process apparatuses (e.g., the second track component 625, the etch tool 640, etc.)

The process apparatus baseliner system 600 comprises a software application 660. In an embodiment, the software application 660 may be provided with or integrated into the metrology apparatus 650 (e.g., in a computer such as the computer system 1500 in FIG. 15 associated with the metrology apparatus 650). Additionally or alternatively, the software application 660 may be incorporated into another portion of the process apparatus baseliner system 600, or provided in a standalone system, such as in a standalone computer system (e.g., the computer system 1500 in FIG. 15), server, processor, etc. In an embodiment, the deposition tool 610, the first track component 620, the lithographic apparatus 630, the second track component 625, the etch tool 640, and/or the metrology apparatus 650 are in communication with the software application 660 so that results, designs, data, etc. of the deposition tool 610, the first track component 620, the lithographic apparatus 630, the second track component 625, the etch tool 640, and/or the metrology apparatus 650 may be stored and analyzed by the software application 660 at the same time or different times.

Figure 7A:
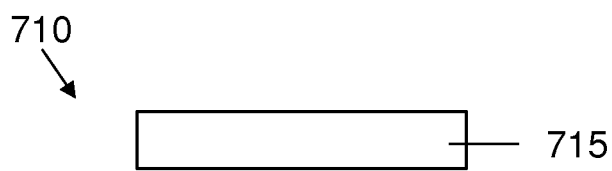
FIG. 7A, FIG. 7B, FIG. 7C, FIG. 7D, FIG. 7E, FIG. 7F and FIG. 7G schematically depict a process of forming a pattern on a substrate and etching the pattern in an etchable layer.

Referring to FIGS. 7A-7G, process steps for forming a substrate 710, 720, 730, 740, 750, 760, 770, 780 in connection with the process apparatus baseliner system 600 are depicted. The substrate may have a same shape as a conventional substrate (e.g., circular disc shaped) and may have a comparable cross-wise dimension (e.g., about 200 mm, about 300 mm, or about 450 mm) as a conventional substrate. As schematically shown in FIG. 7A, at step 710 the substrate includes a substrate layer 715, shown schematically in cross section. In an embodiment, the substrate at step 710 is a production substrate. Accordingly, the substrate layer 715 may include one or more production layers each produced with functional features in addition to bare silicon. In an embodiment, the substrate at step 710 is a monitor substrate. Accordingly, the substrate layer 715 may be a layer of bare silicon. As shown schematically in FIG. 6, one or more substrates with substrate layer 715 are processed at step 710.

Figure 7B:
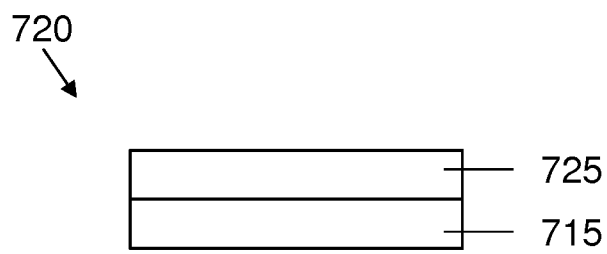

In FIG. 7B, shown schematically in cross section, the substrate at step 720 includes the substrate layer 715 and an etchable layer 725 (e.g., a deposition layer) formed on the substrate layer 715. The etchable layer 725 may be a layer of one or more suitable materials, e.g., silicon oxide, silicon nitride, etc. In an embodiment, the deposition tool 610 may be configured to apply the etchable layer 725 to the substrate layer 715. In an embodiment, the deposition tool 610 applies a deposition layer as the etchable layer 725 by means of, for example, ALD, CVD or PVD. As shown schematically in FIG. 6, one or more substrates, each having the substrate layer 715 and the etchable layer 725, are formed at step 720.

In an embodiment, the thickness of the etchable layer 725 is measured after the etchable layer 725 is applied on the substrate layer 715. In an embodiment, the thickness of the etchable layer 725 may be measured after step 720 is complete and before step 730 starts. In an embodiment, the thickness of the etchable layer 725 is measured by the metrology apparatus 650, or a different metrology apparatus. In an embodiment, the metrology apparatus 650 includes a sensor configured to measure a first position at an upper surface of the etchable layer 725 and a second position at a lower surface of the etchable layer 725. Therefore, the thickness of the etchable layer 725 can be determined as a difference between the first position and the second position. In an embodiment, the thickness of the etchable layer 725 may be measured by a sensor embedded in the deposition tool 610. In an embodiment, the thickness is measured across the substrate to derive a spatial distribution of the thickness across the substrate.

In an embodiment, the thickness of the etchable layer 725 is estimated based upon one or more process variables of the deposition tool 610, which can be used to determine an amount of etchable layer material that has been deposited onto the substrate layer 715. For example, a volume of deposition material per unit time that is applied by the deposition tool 610, i.e., a deposition rate of the deposition tool 610, can be used to estimate the thickness of the etchable layer 725 that has been applied by the deposition tool. For example, various process variables of the deposition tool 610 (such as deposition rate, deposition duration, etc.) can be stored in a database 670, or made accessible by, the software application 660 to determine or estimate the thickness of the etchable layer 725. For example, the database 670 can be developed experimentally to determine how the various process variables of the deposition tool 610 affect the thickness of the etchable layer 725. In this way, in an embodiment, the thickness of the etchable layer 725 can be determined without measuring it directly, for example, by the metrology apparatus 650. In an embodiment, the thickness of the etchable layer 725 for a large plurality of substrates 785 after step 720 is known based on prior measurement and/or experimentation, which is set as a fixed value in software application 660.

While measurement and analysis of thickness of the etchable layer is described, one or more different or additional parameters of the etchable layer 725 may be similarly measured/analyzed.

In an embodiment, the software application 660 may determine a contribution of the deposition tool 610 to a characteristic of the finally etched substrate (after the substrate has been processed by the etch tool 640 at step 770) based on a parameter (e.g., thickness) of the etchable layer 725. In an embodiment, the contribution is mathematically modeled as a function of the parameter of the etchable layer. For example, a mathematical model that relates layer thickness and after etch CD deviations. In the context of the example of layer thickness and after etch CD, the mathematical model can be derived by evaluating the variability of the after etch CD changes for different mean/target deposition thicknesses. The model can be obtained through a calibration process upfront that establishes the relation between, e.g., layer thickness and after etch CD. The model can be derived by evaluating a large number of production substrates where layer thickness and after etch CD were measured and use one or more machine learning algorithms on the data to determine the relation. The characteristic of the finally etched substrate (e.g., see substrate 785 in FIG. 7H) may comprise one or more characteristics (or one or more spatial distributions thereof) selected from: critical dimension (including change in critical dimension, average critical dimension, etc.), critical dimension uniformity, overlay, side wall angle, feature height, bottom surface tilt, pattern shift, and/or geometric asymmetry of a pattern on the finally etched substrate 785. In an embodiment, the characteristic of the finally etched substrate 785 comprises one or more fingerprints of a pattern on the finally etched substrate 785, or one or more fingerprints of the finally etched substrate 785 containing a plurality of the same patterns across the finally etched substrate 785.

A fingerprint of a pattern on the finally etched substrate 785, or a fingerprint of the finally etched substrate 785 containing a plurality of the same patterns across the finally etched substrate 785, can be determined by considering variations across a pattern (or patterns), or variations from pattern to pattern across the finally etched substrate 785. These variations may exist with respect to critical dimension, critical dimension uniformity, overlay, side wall angle, feature height, bottom surface tilt, pattern shift, and/or geometric asymmetry of the pattern on the finally etched substrate 785, or with respect to one or more of the plurality of the same patterns across the finally etched substrate 785. The fingerprint of the pattern(s), or the fingerprint of the finally etched substrate 785 may be measured by the metrology apparatus 650.

In an embodiment, a mathematical model is used to convert the measured parameter (e.g., thickness) of the etchable layer 725 to the contribution of the deposition tool 610 to the characteristic. In an embodiment, the parameter of the etchable layer 725 may be specific to a deposition chamber 611, 612 of the deposition tool 610 that is used to perform the deposition, and may be non-specific to a particular substrate (and so can be used across substrates). Thus, the contribution of the deposition tool 610 to the characteristic may be determined and stored in a database 670 with reference to the applicable deposition chamber 611, 612 of the deposition tool 610 for further use. In an embodiment, the contribution of the deposition tool 610 to the characteristic is pre-characterized and obtained from the database 670 with reference to the deposition chamber 611, 612 of the deposition tool 610 that is used in the deposition process of a particular patterning process.

Figure 7C:
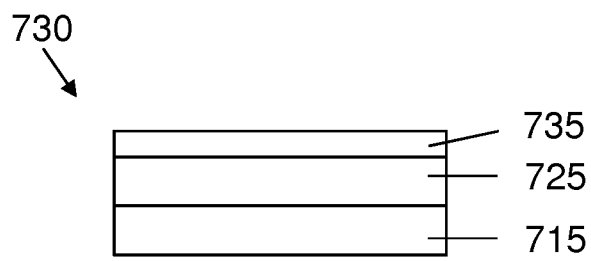

As schematically shown in FIG. 7C, a resist layer 735 (e.g., a photoresist) may be provided on the etchable layer 725 at step 730. In an embodiment, the first track component 620 may be configured to apply the resist layer 735 on the etchable layer 725, for example, on each of a plurality of etchable layers 725 to form a group of substrates at step 730, as shown schematically in FIG. 6. In an embodiment, the first track component 620 that provides the resist layer 735 comprises a resist coating component of the track. As shown schematically in FIG. 6, one or more substrates, each having a substrate layer 715, an etchable layer 725, and a resist layer 735, are formed at step 730. Similar measurement and analysis processes as described above for deposition can be used for the resist layer at this stage (e.g., determine a spatial distribution of resist thickness, resist refractive index, etc.).

Figure 7D:
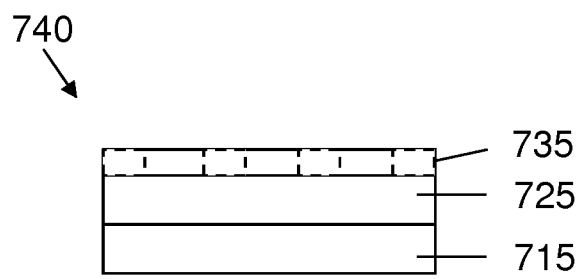

Referring to FIG. 7D, the substrate includes the substrate layer 715, the etchable layer 725, and the resist layer 735 which has been exposed in a patterning process, as shown at step 740. In an embodiment, the lithographic apparatus 630 at step 740 is configured to produce one or more patterns in the resist layer 725 applied on one or more substrates 730 as shown schematically in FIG. 6. In FIG. 7D, the patterns are shown embedded in the resist layer 735 of the substrate since the resist has not been developed yet. The lithographic apparatus 630 may comprise an optical lithographic apparatus such as that described in respect of FIG. 1, or for example, a nanoimprint lithography tool. For example, an optical lithographic apparatus 630 can expose the resist layer 735 of one or more substrates to transfer a pattern from the patterning device 635 (see FIG. 6) to the resist layer 735 on the one or more substrates as shown at step 740. The patterning device 635 may be used to produce a pattern of a functional device on the substrate at step 740 when the substrate is a production substrate. Alternatively, the patterning device 635 may be used to produce a pattern design for metrology purposes when the substrate is a monitor substrate. For example, the patterning device 635 may be used to produce a periodic structure, such as a line-and-space grating.

In an embodiment, the software application 660 may be configured to determine a contribution of the lithographic apparatus 630 to the characteristic of the finally etched substrate 785. The contribution of the lithographic apparatus 630 to the characteristic of the finally etched substrate 785 is derived from one or more variables related to the lithographic apparatus 630. In an embodiment, the group of one or more variables related to the lithographic apparatus 630 may include one or more first variables non-specific to the substrate. Accordingly, the contribution of the lithographic apparatus 630 includes a first contribution of the lithographic apparatus 630 derived from the one or more first variables that are non-specific to the particular substrate (and so can be used across substrates of the patterning process). Further, the first contribution of the lithographic apparatus 630 may be stored in the database 670 for future use. In an embodiment, the first contribution of the lithographic apparatus 630 may be pre-characterized and obtained from the database 670. In an embodiment, the one or more first variables may include, but are not limited to, one or more variables of illumination by the lithographic apparatus 630, one or more variables of a projection system of the lithographic apparatus 630, focus, dose, overlay, laser bandwidth, exposure duration, optical aberration, a high frequency laser bandwidth change, a high frequency laser wavelength change, Jones pupil, etc. In addition or alternatively, the group of one or more variables related to the lithographic apparatus 630 may include one or more second variables specific to the particular substrate. Accordingly, the contribution of the lithographic apparatus 630 may include a second contribution of the lithographic apparatus 630 derived from the one or more second variables that are specific to the particular substrate. In an embodiment, the one or more second variables may include, but are not limited to, a moving standard deviation (MSD) of movement of a substrate stage of the lithographic apparatus 630, and/or a moving average (MA) of movement of the substrate stage of the lithographic apparatus 630.

Similar measurement and analysis processes as described above for deposition can be used for the patterned resist at this stage. For example, values of the one or more first and/or second variables can be derived from sensors within the lithographic apparatus (e.g., interferometers, exposure sensors, etc.), from the machine's devices (e.g., actuator signals, laser signals, etc.), etc.

Figure 7E:
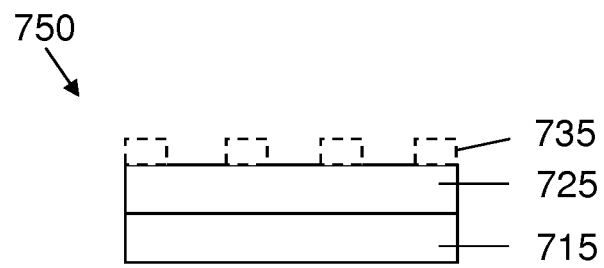

In an embodiment, referring to FIG. 6, after the patterning by the lithographic apparatus 630, the second track component 625 is used to develop the exposed resist after the pattern transfer of the lithographic apparatus 630 to form one or more patterned substrates at step 750. As shown in FIG. 7E, after development, the patterns transferred from the patterning device 635 to the resist layer 735 can be seen clearly in the patterned substrate, as shown at step 750. Specifically, four pattern lines are shown in the resist layer 735 in FIG. 7E. However, any suitable number of pattern lines (or another type of patterns) may be produced in the resist layer 735 of the patterned substrate at step 750. In an embodiment, the second track component 625 is a development component of the track and/or a bake plate component of the track. In an embodiment, the first track component 620 and the second track component 625 are different tracks. In an embodiment, the first track component 620 and the second track component 625 are different components of the same track.

Similar measurement and analysis processes as described above for deposition can be used for the developed/baked resist at this stage. For example, values of refractive index of the resist, thickness of the resist, etc. can be determined using a measurement apparatus.

Figure 7F:
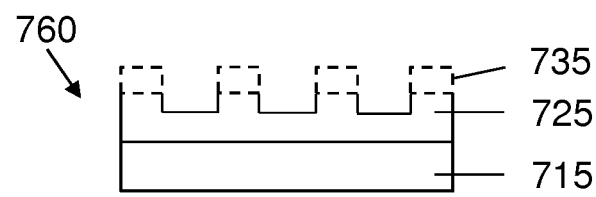
Figure 7G:
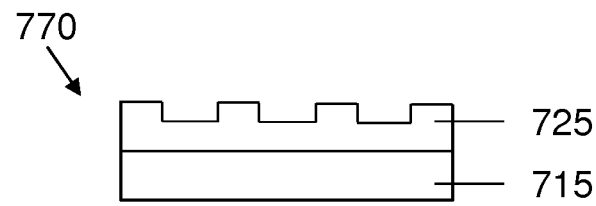

FIG. 7F schematically shows a side view cross section of the etched substrate after etching, at step 760. As shown, a portion of the etchable layer 725 that is not covered by the resist layer 735 (specifically, the patterns in the resist layer 735) is etched because the resist of the resist layer 735 resists etching at least in part. In an embodiment, the etch tool 640 is configured to etch the etchable layer 725 or to transfer the one or more patterns in the resist layer 735 to the etchable layer 725 to form the etched substrate at step 760. As shown in FIG. 7G, at step 770, after the etching is completed, where needed, the resist layer 735 is removed from the etched substrate. Specifically, four pattern lines are produced in the etchable layer 725 as shown in FIG. 7G. However, any suitable number of pattern lines (or another type of patterns) may be produced in the etchable layer 725 of the finally etched substrate 785. One or more patterns (e.g., pattern lines) in the etchable layer 725 may be configured to be measured by the metrology apparatus 640.

Figure 7H:
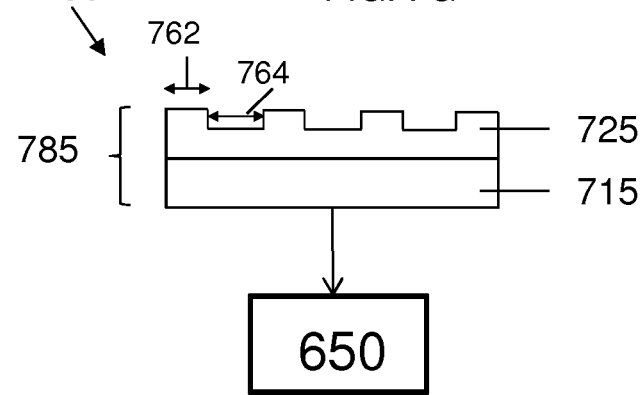
FIG. 7H schematically depicts a diagram of measuring an etched substrate using a metrology apparatus.

As schematically shown in FIG. 7H, at step 780, the metrology apparatus 650 may be configured to evaluate a characteristic of the finally etched substrate 785. For example, the metrology apparatus 650 may be configured to measure a characteristic of a pattern of a metrology target on the finally etched substrate 785. In an embodiment, the metrology apparatus 650 may be an optical (e.g., diffraction-based) metrology tool that can measure the characteristic of the finally etched substrate 785 (specifically, the pattern of the metrology target on the finally etched substrate 785). In an embodiment, the characteristic may comprise one or more characteristics selected from: critical dimension (e.g., a width of a pattern line 762 and/or a spacing 764 between adjacent pattern lines), critical dimension uniformity, overlay, side wall angle, feature height, bottom surface tilt, pattern shift, and/or geometry asymmetry of a pattern on the finally etched substrate 785, or of each of the plurality of the same patterns across the finally etched substrate 785. In an embodiment, the characteristic may comprise one or more fingerprints of the pattern on the finally etched substrate 785, or one or more fingerprints of the finally etched substrate containing a plurality of the same patterns, the one or more fingerprint being associated with one or more characteristics selected from: critical dimension, overlay, side wall angle, feature height, bottom surface tilt, pattern shift, and/or geometry asymmetry. In an embodiment, the metrology apparatus 650 may also include a level sensor to measure a position of a surface, e.g., a height and/or rotational position of a surface of the finally etched substrate 785.

In an embodiment, the software application 660 may be configured to determine a contribution of the etch tool 640 to the characteristic of the finally etched substrate 785. Specifically, the contribution of the etch tool 640 to the characteristic may be obtained by removing from the characteristic of the finally etched substrate 785, one or more contributions of one or more process apparatuses that are upstream from the etch tool 640. As shown in FIG. 6, the one or more process apparatuses that are upstream from the etch tool 640 includes the deposition tool 610, the first track component 620, the lithographic apparatus 630, and the second track component 625. In an embodiment, the first track component 620 and the second track component 625 can typically make very small, and even negligible, contributions to the characteristic of the finally etched substrate 785 compared with the deposition tool 610 and the lithographic apparatus 630. Therefore, the one or more contributions of one or more process apparatuses upstream from the etch tool 640 may include the contribution of the deposition tool 610 and the contribution of the lithographic apparatus 630. Accordingly, the contribution of the etch tool 640 to the characteristic of the finally etched substrate 785 may be determined by removing the contribution of the deposition tool 610 (a pre-lithography process apparatus) and the contribution of the lithographic apparatus 630 from the characteristic of the finally etched substrate 785. In an embodiment, the contribution of the lithographic apparatus 630 to the characteristic of the finally etched substrate 785 may include a first contribution of the lithographic apparatus 630 that is non-specific to the particular substrate and/or a second contribution of the lithographic apparatus 630 that is specific to the particular substrate. In an embodiment, the contribution of the etch tool 640 to the characteristic of the finally etched substrate 785 is non-specific to a particular patterned substrate. In an embodiment, the contribution of the etch tool 640 to the characteristic of the finally etched substrate 785 is specific to an etch chamber 641, 642 of the etch tool 640 that is used for etching. Thus, after determination, the contribution of the etch tool 640 may be stored in the database 670 with reference to the etch chamber 641, 642 of the etch tool 640 that is used for etching.

In an example case, existing variables of the deposition tool 610, the lithographic apparatus 630, and the etch tool 640 can be such that the deposition tool 610 may contribute, for example, 0.2 nm to a fingerprint (e.g., CD fingerprint) of a pattern on the finally etched substrate 785, the lithographic apparatus 630 may contribute, for example, 0.4 nm to the fingerprint of the pattern on the finally etched substrate 785, and the etch tool 640 may contribute, for example, 0.2 nm to the fingerprint of the pattern on the finally etched substrate 785. Therefore, the cumulative contribution of the deposition tool 610, the lithographic apparatus 630, and the etch tool 640 to the fingerprint of the pattern on the finally etched substrate 785 would be 0.9 nm, which is below a hypothetical threshold of, for example, 1 nm.

In the example, after step 720, if the contribution of the deposition tool 610 to the fingerprint of the pattern on the finally etched substrate 785 is determined to be 0.5 nm, this indicates that without adjusting the lithographic apparatus 630 and/or the etch tool 640, the cumulative contribution of the deposition tool 610, the lithographic apparatus 630, and the etch tool 640 would be 1.1 nm, which would be 0.1 nm above the hypothetical threshold. Or, in the example, after step 760, if the contribution of the etch tool 640 to the fingerprint of the pattern on the finally etched substrate 785 is determined to be 0.5 nm, this indicates that without adjusting the deposition tool 610 and/or the lithographic apparatus 630, the cumulative contribution of the deposition tool 610, the lithographic apparatus 630, and the etch tool 640 would be 1.1 nm, which would be 0.1 nm above the hypothetical threshold. In some examples, these situations may produce a defect and/or lead to yield loss.

To remedy this, one or more variables (e.g., thickness, thickness uniformity or any other suitable variables) of the deposition tool 610, one or more variables (e.g., dose, focus, and/or any other suitable variables) of the lithographic apparatus 630, and/or one or more variables (e.g., etch rate, etch type, operating temperature, and/or any other suitable variables) of the etch tool 640 may be adjusted before operating the deposition tool 610, the lithographic apparatus 630 and/or the etch tool 640 as applicable to reduce the cumulative contribution to a value below the threshold, e.g., below 1 nm.

In another example, a critical dimension of a pattern on the resist layer 735 after development (CD_Litho) is at, for example, 30 nm. After etch, a critical dimension of a pattern on the etchable layer 725 of the finally etched substrate 785 (CD_etch) is at, for example, 25 nm. The difference between CD_etch and CD_litho, i.e., 5 nm, is referred to as a litho-etch bias, which may be based on the contribution of the deposition tool 610, e.g., based on the thickness of the etchable layer 715 (e.g., the litho-etch bias is 5 nm when the thickness of the etchable layer 715 is at e.g., 100 nm). The litho-etch bias may be further determined based on one or more variable settings of the etch tool 640, e.g., an etch rate, an etch type, operating temperature and/or other variable of an etch chamber 641, 642 of the etch tool 640. Thus, the deposition tool 610, the lithographic apparatus 630, and the etch tool 640 may all contribute to CD_etch. As described above, CD_etch can be determined by adding CD_litho and the litho-etch bias. Specifically, CD_litho may be changed by adjusting one or more variables of the lithographic apparatus 630, e.g., dose and/or any other suitable variable related to the lithographic apparatus. The litho-etch bias may be changed by adjusting one or more variables (e.g., deposition rate, deposition duration, etc.) of the deposition tool 610 which may result in a different thickness of the etchable layer 715 (e.g., initially targeted at 100 nm). In addition or alternatively, the litho-etch bias may also be changed by adjusting one or more variables (e.g., etch rate, etch type, operating temperature) of the etch tool 640. After step 720, if the thickness of the etchable layer 715 is measured to be 110 nm (which is larger than, e.g., a target 100 nm), this indicates the litho-etch bias may be increased, e.g., from 5 nm to 8 nm. Therefore, without adjusting the lithographic apparatus 630 and/or the etch tool 640, CD_etch may be deviated from a targeted value, due to the increased litho-etch bias. To remedy this, for example, CD_litho may be retargeted from e.g., 25 nm, to a smaller value, e.g., 23 nm before operating the lithographic apparatus 630 so that the resulting CD_etch may be, or may be closer to, the target. This can be done by, for example, changing the dose of the lithographic apparatus 630, for example, depending on the dose latitude (where the dose latitude indicates a sensitivity of the critical dimension (specifically, CD_litho) with respect to a change of dose value). It should be noted that this can be done by adjusting one or more other suitable variables of the lithographic apparatus 630 alternatively or in addition to the dose of the lithographic apparatus 630. In addition or alternatively to adjusting the one or more variables related to the lithographic apparatus 630 before operation of the lithographic apparatus 630, one or more variables related to the deposition tool 610 may be adjusted before operation of the etch tool 610 and/or one or more variables related to the etch tool 640 may be adjusted before operation of the etch tool 640. More details about this feed-forward method will be described in FIG. 8.

So, in an embodiment, a feed-forward type correction can be made (which will be described in more detail with respect to FIG. 8). For example, in an embodiment, one or more variables related to the lithographic apparatus 630 (e.g., dose, focus, etc.) may be adjusted based on the contribution of the deposition tool 610 before operating the lithographic apparatus 630. For example, in an embodiment, one or more variables related to the etch tool 640 may be adjusted before operating the etch tool 640 based on the total contributions of the deposition tool 610 and/or the lithographic apparatus 630 to the characteristic of the finally etched substrate 785. The one or more variables related to the etch tool 640 may include, but are not limited to, an etch rate, an etch type, an operating temperature, and/or any other suitable variable of the etch tool 640. This is done so that the adjustment in the one or more variables related to the etch tool 640 may compensate for at least a portion of the total contribution of the deposition tool 610 and the lithographic apparatus 630 to the characteristic of the finally etched substrate 785, thereby reducing a deviation of the characteristic of the finally etched substrate 785 from a target value of the characteristic of the finally etched substrate 785. In some examples, when the cumulative contribution of the deposition tool 610 and/or the lithographic apparatus 630 to the characteristic will deviate too much from the target, the patterned substrate at step 720 may be reworked (e.g., the resist layer 735 will be stripped away) rather than processed by the etch tool 640.

Figure 7I:
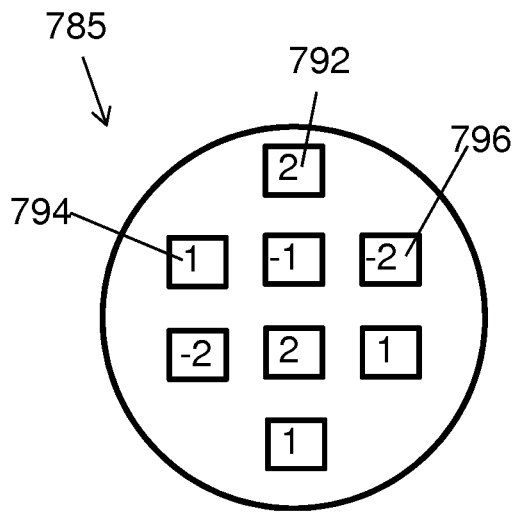
FIG. 7I schematically depicts a fingerprint of a finally etched substrate.

FIGS. 7I-7L show an example of a method of determining a contribution of the etch tool 640 to a fingerprint of the finally etched substrate 785 according to the embodiment as described above. FIG. 7I is a schematic view showing the finally etched substrate 785. The finally etched substrate 785 comprises a plurality of dies 792, 794, 796, etc., formed therein. Each of the dies 792, 794, 796, etc., comprises a same pattern or patterned configuration to be measured by the metrology apparatus 650, although slight variance in various characteristics may exist from pattern to pattern (or from substrate to substrate). In an embodiment, variances of a particular characteristic (e.g., critical dimension, etc.) can be considered deviations from the designed or target pattern. In an embodiment, those variances of the particular characteristic can be considered to be the deviation from an average pattern of a group of the patterns on the finally etched substrate 785. The variances can be quantified or otherwise characterized. Those variances can be, in one example, considered in total across the substrate to be a fingerprint of the finally etched substrate 785. The variances, or fingerprint of the finally etched substrate 785, in FIG. 7I, shows a variance, for this simple example, in each die expressed by a number (e.g., in nm or any unit of measure) as shown in the die, depending upon the quantification of deviation of the associated pattern from a target (or designed) pattern configuration or the average pattern of the finally etched substrate 785. For example, in an embodiment, values for the fingerprint of the patterns in the dies 792, 794, 796, etc., are 2 nm, 1 nm, −2 nm, etc., respectively. These variances are determined using measurements made by the metrology apparatus 650 (e.g., subtracting a certain value (such as a target or design value for the target or design pattern configuration or an average of the measurements of a group of the patterns (in the dies 792, 794, 796, etc.) on the finally etched substrate 785) from the measurement made by the metrology apparatus 650.

Figure 7J:
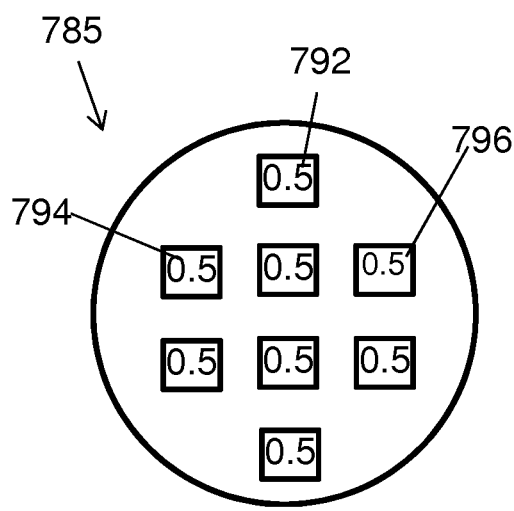
FIG. 7J schematically depicts a contribution of a deposition tool to the fingerprint of the finally etched substrate.

FIG. 7J schematically shows a contribution of the deposition tool 610 to the fingerprint of the finally etched substrate 785. The contribution of the deposition tool 610 can be estimated according to a mathematical model that is based on the thickness of the etchable layer 725. For example, as shown in FIG. 7J, the mathematical model may hypothetically attribute a 0.5 nm contribution to the pattern in each die 792, 794, 796, etc., based on the mathematical model.

Figure 7K:
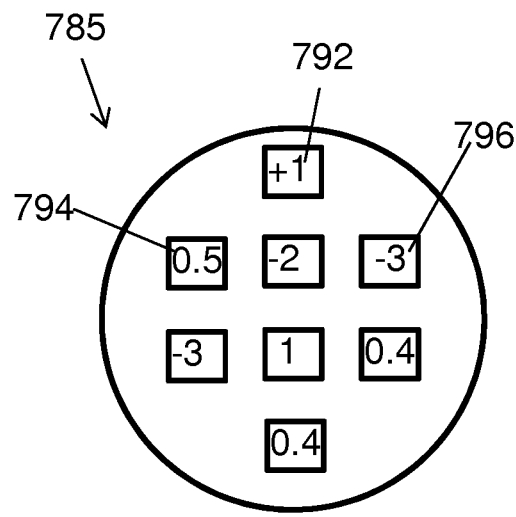
FIG. 7K schematically depicts a contribution of a lithographic apparatus to the fingerprint of the finally etched substrate.

FIG. 7K schematically shows a contribution of the lithographic apparatus 630 to the fingerprint of the finally etched substrate 785. The contribution of the lithographic apparatus may be estimated based on one or more variables related to the lithographic apparatus 630 as described above. For example, as shown in FIG. 7K, the lithographic apparatus 630 may attribute 1 nm, 0.5 nm, −3 nm, etc. to the patterns in the dies 792, 794, 796, etc., respectively.

Figure 7L:
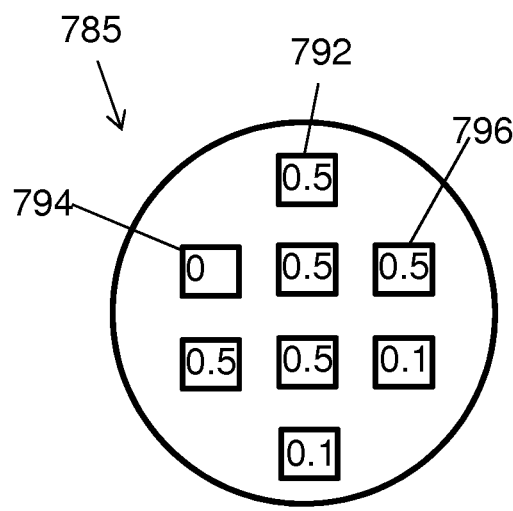
FIG. 7L schematically depicts a contribution of an etch tool to the fingerprint of the finally etched substrate.

FIG. 7L schematically shows a contribution of the etch tool 640 to the fingerprint of the finally etched substrate 785. The contribution of the etch tool 640, as shown in FIG. 7L, may be derived by subtracting the contribution of the deposition tool 610 as shown in FIG. 7J and the contribution of the lithographic apparatus 630 as shown in FIG. 7K from the fingerprint of the finally etched substrate 785 as shown in FIG. 7I. Specifically, for example, the etch tool 640 may attribute 0.5 nm, 0 nm, 0.5 nm, etc., to the patterns in the dies 792, 794, 796, etc., respectively.

In an embodiment, the software application 660 may be configured to create modification information using the determined contribution of the etch tool 640 (optionally within a tolerance range) to the characteristic. For example, the software application 660 may be configured to determine whether the determined contribution of the etch tool 640 meets or crosses a threshold value (e.g., within a tolerance range) for the contribution of the etch tool 640 (or another process apparatus) (which can include a tolerance range). In an embodiment, the software application 660 determines a deviation (e.g., a difference) of the determined contribution of the etch tool 640 (or another process apparatus) from the threshold value. For example, the threshold value for the contribution of the etch tool 640 to a characteristic (e.g., critical dimension fingerprint, etc.) of a pattern on the finally etched substrate 785 may, in a hypothetical example, be set to 0.2 nm. If the determined contribution of the etch tool 640 to the characteristic of the pattern on the finally etched substrate 785 is 0.5 nm, the deviation is determined to be 0.3 nm by the software application 660. In an embodiment, the software application 660 determines a spatial distribution of whether the determined contribution of the etch tool 640 to the characteristic meets the threshold value across the substrate.

In addition or alternatively, the software application 660 may be configured to create modification information using the measurement data directly (e.g., the characteristic or the spatial distribution of the characteristic across the finally etched substrate 785, e.g., critical dimension, critical dimension uniformity, side wall angle, feature height, bottom surface tilt, pattern shift, geometric asymmetry, etc.) from the metrology apparatus 650. For example, the software application 660 may be configured to determine whether a measured value of the characteristic measured by the metrology apparatus 650 meets a target value of the characteristic (which can include a tolerance range). In an embodiment, the software application 660 determines a deviation (e.g., a difference) between the measured value of the characteristic measured by the metrology apparatus 650 and the target value of the at least one characteristic. In an embodiment, the deviation may be a critical dimension error, a side wall angle error, a feature height error, a bottom surface tilt error, a pattern shift error, etc. In an embodiment, the software application 660 determines a spatial distribution of whether the measured value of the characteristic measured by the metrology apparatus 650 meets the target value of the characteristic across the finally etched substrate 785.

An action can be taken responsive to a determination that the determined contribution of the etch tool 640 (or another process apparatus) does not meet or cross a threshold value, and/or a measured value of the characteristic measured by the metrology apparatus 650 does not meet or cross a target value of the characteristic (which can include a tolerance range). In an embodiment, the software application 660 can notify a user of such a determination by displaying the information together with the notification on a graphical user interface (GUI).

In an embodiment, the software application 660 is configured to create modification information to modify one or more variables (e.g., an etch rate, an etch type, and/or an operating temperature of one or more etch chambers 611, 612) of the etch tool 640 to, e.g., correct (e.g., eliminate or reduce to within a tolerance range) the deviation between the determined contribution of the etch tool 640 (or another process apparatus) and the threshold value, and/or the deviation between the measured value of the characteristic measured by the metrology apparatus 650 and the target value of the characteristic. In an embodiment, the modification may spatially specific (e.g., apply spatially different modifications) or apply a uniform offset across the pattern/substrate. In an embodiment, the modification information may be used to adjust the etch tool 640 based at least in part on the deviation (e.g., a difference). Specifically, the modification information may be created to adjust one or more variables of the etch tool 640. For example, the modification information may be used to modify one or more etch variables (e.g., etch rate, etch type, operating temperature, etc.) spatially based on the spatial distribution of the deviation or of the measured values of the characteristic.

In an embodiment, the modification information may be used to adjust one or more variables (e.g., an etch rate, an etch type, operating temperature, etc.) to match the performance of two or more etch tools 640, and/or to match different etch chambers of the same etch tool 640, and/or to match different etch chamber of different etch tools 640. Thus, the target value from which a deviation is evaluated is a contribution of another etch tool 640 and/or etch chamber 641, 642 to a characteristic. For example, an etched substrate 785 may be formed by etching the etchable layer 725 using a first etch chamber 641 of the etch tool 640, using a second etch chamber 642 of the etch tool 640, or both. In order to match the performance between the first etch chamber 641 and the second etch chamber 642, the software application 660 may be configured to determine a deviation between a first contribution of the first etch chamber 641 to a characteristic of a first pattern processed by the first etch chamber 641 of the etch tool 640 and a second contribution of the second etch chamber 642 to a same characteristic of a second pattern processed by the second etch chamber 642 of the etch tool 640. The software application 660 may be further configured to create modification information to adjust one or more etch variables (e.g., the etch rate, etch type, operating temperature, etc.) of the first etch chamber 641 and/or of the second etch chamber 642 in order to correct the deviation between the first contribution and the second contribution. Thus, in an embodiment, the modification information can cause the first contribution (of the first etch chamber 641 of the etch tool 640) to match within a tolerance range the second contribution (of the second etch chamber 642 of the etch tool 640). As such, after modification, the performance of the first etch chamber 641, 642 of the etch tool 640 may be matched within a tolerance range to the performance of the second etch chamber 642 of the etch tool 640.

While the discussion has focused on monitoring or evaluating an etch tool, in an embodiment, the process apparatus baseliner system 600 may be used to monitor another non-lithography process apparatus, such as the second track (or a component thereof such as a development tool or a bake tool), a deposition tool, a chemical mechanical polishing/planarization (CMP) tool or other non-lithography process tool that changes a physical characteristic of the substrate. In the case of one or more such tools, the layer 725 need not be etchable and of course, the processing of the substrate need not involve an etching (e.g., a development component or a bake component of a track).

So, when the evaluated tool is a track, the modification information may be used to adjust one or more track variables, such as a bake temperature (e.g., global change or a spatially distributed change) of a bake tool. When the evaluated tool is a deposition tool, the modification information may be used to adjust one or more deposition variables (e.g., global or spatial change in rate of deposition, spatial variance of deposition, etc.). When the evaluated tool is a CMP tool, the modification information may be used to adjust one or more planarization variables (e.g., global or spatial change in rate of planarization, spatial variance of planarization, etc.).

In an embodiment, the measured values and/or the modification information can be specific to a particular apparatus, e.g., specific to etch chambers of an etch tool, specific to an etch tool among a plurality of etch tools, etc. Thus, the monitoring and/or control can be specific to tools and/or parts thereof. So, for example, based on what tools and/or parts thereof are being used in a particular patterning process of a functional device, appropriate modification information can be applied to the tool(s) and/or part(s) thereof being used to process one or more substrates in the patterning process.

Further, the deviation in the etch tool 640 (or a non-lithography process tool as described above, e.g., the second track component 625, a deposition tool, the CMP tool, etc.) can be corrected in another tool, e.g., a non-lithography process tool (e.g., the deposition tool 610, the first track component 620) or the lithographic apparatus 630, or vice versa. Thus, the modification information need not be for the tool being evaluated. For example, one or more lithography variables of the lithographic apparatus 630 can be adjusted. In an embodiment, the one or more lithography variables include a dose and/or a focus. As an example, the modification information may be created to adjust one or more modification apparatuses of the lithographic apparatus, e.g., by employing the adjustment mechanism AM to correct for or apply an optical aberration, by employing the adjuster AD to correct or modify an illumination intensity distribution, by employing the positioner PM of the patterning device support structure MT to correct or modify the position of the patterning device support structure MT, by employing the positioner PW of the substrate table WT to correct or modify the position of the substrate table WT, etc.

Thus, in an example of evaluation of a non-lithography process tool, modification information may be created to modify one or more variables of the non-lithography process tool, and/or one or more process apparatuses upstream or downstream from the non-lithography process tool. The one or more process tools may include, e.g., the deposition tool 610, the first track component 620, the lithographic apparatus 630, the second track component 625, the etch tool 640, etc.

In an embodiment, the software application 660 uses one or more mathematical models to determine a deviation in the characteristic correctable by one or more selected from: the deposition tool 610, the first track component 620, the lithographic apparatus 630, the second track component 625, the etch tool 640, and/or one or more other process apparatuses, for example, a chemical mechanical planarization tool (not shown). The software application 660 may be further configured to provide the modification information that enables configuration of one or more tools selected from: the deposition tool 610, the first track component 620, the lithographic apparatus 630, the second track component 625, the etch tool 640, and/or one or more other process apparatuses to correct (e.g., eliminate or reduce to within a tolerance range) the deviation. In an embodiment, one or more of the mathematical models define a set of basis functions that fit the data once parameterized. In an embodiment, the model includes modifications that can be made to one or more apparatuses, selected from: the deposition tool 610, the first track component 620, the lithographic apparatus 630, the second track component 625, the etch tool 640 and/or one or more other process apparatuses (e.g., a chemical mechanical planarization tool). The software application 660 can determine whether a correctable deviation is within a specific range. That is, the range of modifications that can be made to a specified one or more of the processing apparatuses may have an upper limit, a lower limit, and/or both in connection with an amount of modification that can be made to the one or more variables of the applicable process tool.

For example, in an embodiment, the correctable deviation of the lithographic apparatus 630 in an x direction, i.e., $\Delta x$ at the coordinate (x,y), can be modeled by:

$$\Delta x = k_1 + k_3 x + k_5 y + k_7 x^2 + k_9 xy + k_{11} y^2 + k_{13} x^3 + k_{15} x^2 y + k_{17} xy^2 + k_{19} y^3 \quad (1)$$

where k1 is a parameter (that may be constant), and k3, k5, k7, k9, k11, k13, k15, k17, and k19 are parameters (that may be constant) for the terms x, y, $x^2$, xy, $y^2$, $x^3$, $x^2 y$, $xy^2$, and $y^3$, respectively. One or more of k1, k3, k5, k7, k9, k11, k13, k15, k17, and k19 may be zero.

Relatedly, in an embodiment, the correctable deviation of the lithographic apparatus 630 in a y direction, i.e., $\Delta y$ at the coordinate (x,y), can be modeled by:

$$\Delta y = k_2 + k_4 y + k_6 x + k_8 y^2 + k_{10} yx + k_{12} x^2 + k_{14} y^3 + k_{16} y^2 x + k_{18} yx^2 + k_{20} x^3 \quad (2)$$

where $k_2$ is a parameter (that may be constant), and $k_4$, $k_6$, $k_8$, $k_{10}$, $k_{12}$, $k_{14}$, $k_{16}$, $k_{18}$, and $k_{20}$ are parameters (that may be constant) for the terms y, x, $y^2$, yx, $x^2$, $y^3$, $y^2 x$, $yx^2$, and $x^3$, respectively. One or more of $k_2$, $k_4$, $k_6$, $k_8$, $k_{10}$, $k_{12}$, $k_{14}$, $k_{16}$, $k_{18}$, and $k_{20}$ may be zero.

In an embodiment, co-optimization of the deviation correction by two or more process apparatuses (e.g., two or more selected from: the deposition tool 610, the first track component 620, the lithographic apparatus 630, the second track component 625, and/or the etch tool 640) is provided.

In an embodiment, the co-optimization is performed separately or on a combined basis for different types of deviation, such as performed separately or on a combined basis for critical dimension error, pattern shift error, etc. In an embodiment, the deposition tool 610, the first track component 620, the lithographic apparatus 630, the second track component 625, and/or the etch tool 640 may be better able to correct certain types of error and so the deviation correction is appropriately weighted or apportioned among the suitable different variables of two or more selected process tools.

In an embodiment, the software application 650 is configured to identify one or more pattern targets for application to the substrate 750, 760 and for measurement with a process apparatus baseliner system, and develop a metrology recipe for the one or more targets. A metrology recipe in this context is one or more variables (and one or more associated values) associated with the metrology apparatus 640 itself used to measure the one or more metrology targets and/or with the measurement process, such as one or more wavelengths of the measurement beam, one or more types of polarization of the measurement beam, one or more dose values of the measurement beam, one or more laser bandwidths of the measurement beam, one or more aperture settings of the inspection apparatus used with the measurement beam, an alignment mark used to locate the measurement beam on the target, an alignment scheme used, a sampling scheme of a plurality of targets, a layout of the targets, a movement scheme to measure the targets and/or points of interest of a target, etc.

In an embodiment, the one or more targets may be designed and qualified for the patterning process. For example, a plurality of target designs may be evaluated to identify the one or more targets that minimize residual variation (systematic and/or random). In an embodiment, a plurality of target designs may be evaluated to identify the one or more targets whose performance match a functional device, e.g., identify a target whose measure of critical dimension, pattern shift, etc. matches the critical dimension, pattern shift, etc. of the device. The target may be designed, e.g., for measurement of critical dimension (CD), of pattern shift, of side wall angle, of feature height, of bottom surface tilt, of geometric asymmetry in the target, etc. or any combination selected therefrom.

Figure 8:
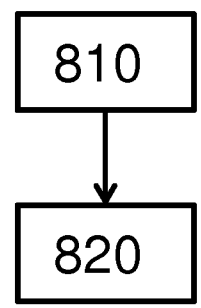
FIG. 8 depicts an example flow of a method to adjust one or more substrate manufacturing variables, according to an embodiment of the disclosure.

Referring to FIG. 8, an example flow of a feed-forward method is depicted. The feed-forward method may be used to adjust one or more variables of one or more second process apparatuses based on one or more contributions of one or more first process apparatuses that are upstream or downstream from the one or more second process apparatuses to a characteristic of a substrate. At step 810, the one or more contributions of the one or more first process apparatuses to the characteristic of a finally etched substrate (e.g., the finally etched substrate 785) are estimated by the software application 660, as discussed previously, where the one or more second process apparatuses are upstream or downstream of the applicable one or more first process apparatuses. In an embodiment, at least one of the one or more first process apparatuses is downstream from a lithographic apparatus (e.g., the lithographic apparatus 630), such the etch tool 640. In an embodiment, at least one of the one or more second process apparatuses is the lithographic apparatus 630. In an embodiment, the one or more contributions of the one or more first process apparatuses to the characteristic of a finally etched substrate (e.g., the finally etched substrate 785) are determined by the software application 660, as discussed previously, using a measurement after processing by the one or more first process apparatuses where the one or more second process apparatuses are downstream of the applicable one or more first process apparatuses. In an embodiment, at least one of the one or more first process apparatuses is upstream from a lithographic apparatus (e.g., the lithographic apparatus 630). For example, the one or more first process apparatuses may include a deposition tool (e.g., the deposition tool 610) and/or the resist coating component of a track (e.g., the first track component 620). In an embodiment, at least one of the one or more second process apparatuses is the lithographic apparatus 630 and/or etch tool 640.

At step 820, information regarding the one or more second process apparatuses is created and output by a hardware computer system (e.g., the software application 660) based at least in part on the estimated or otherwise determined one or more contributions. In an embodiment, the one or more second process apparatuses may be, as appropriate, one or more from a deposition tool (e.g., deposition tool 610), a resist coating component of the track (e.g., the first track component 620), the lithographic apparatus (e.g., the lithographic apparatus 630), a development component of the track (e.g., the second track component 625), a bake plate component of the track (e.g., the second track component 625), and/or the etch tool (e.g., the etch tool 640). In an embodiment, the information regarding the one or more second process apparatuses is modification information that can be used to adjust at least one of the second process apparatuses. In an embodiment, the modification information may be created to adjust one or more variables of the one or more second process apparatuses. For example, the one or more variables of the one or more second process apparatuses may include, but are not limited to, dose and/or focus of the lithographic apparatus (e.g., the lithographic apparatus 630), and/or etch rate, etch type, and/or operating temperature of the etch tool (e.g., the etch tool 640).

For example, the one or more first process apparatuses may include a deposition tool (e.g., the deposition tool 610). Thus, the contribution of the deposition tool 610 to the characteristic of e.g., an etched substrate (e.g., the finally etched substrate 785) is estimated at step 810, e.g., based on the thickness of an etchable layer (e.g., the etchable layer 725) applied by the deposition tool 610. In an embodiment, the second process apparatus may comprise a lithographic apparatus (e.g., the lithographic apparatus 630) and/or an etch tool (e.g., the etch tool 640). Thus, the modification information may be created at step 820 for adjusting the one or more variables of the etch tool and/or adjusting one or more variables of the lithographic apparatus based on the determined contribution of the deposition tool. Specifically, the one or more variables of the etch tool may include an etch rate of the etch tool, an etch type of the etch tool, and/or an operating temperature of the etch tool. The one or more variables of the lithographic apparatus may include a dose, and/or a focus of the lithographic apparatus.

In another example, the one or more first process apparatuses may include a deposition tool (e.g., the deposition tool 610) and a lithographic apparatus (e.g., the lithographic apparatus 630). The contribution of the deposition tool and the contribution of the lithographic apparatus to the characteristic of e.g., an etched substrate (e.g., the finally etched substrate 785) are estimated, respectively, at step 810. The second process apparatus may be an etch tool. Thus, when a total contribution of the lithographic apparatus and the deposition tool meets or crosses a threshold (e.g., falls within a threshold range), the modification information may be created at step 820 for adjusting the one or more variables of the etch tool based on the determined contributions of the deposition tool and the lithographic apparatus. Specifically, the one or more variables of the etch tool may include an etch rate of the etch tool, an etch type of the etch tool, or an operating temperature of the etch tool. In an embodiment, when the total contribution of the deposition tool and the lithographic apparatus to the fingerprint is too large, e.g., falls out of a threshold range when considered in light of the contribution by the etch tool, the substrate that has been processed by the deposition tool and the lithographic apparatus (e.g., the patterned substrate 750) may be reworked rather than processed by the etch tool.

In another example, the one or more first process apparatuses may include an etch tool (e.g., the etch tool 640). The contribution of the etch tool to the characteristic of e.g., an etched substrate (e.g., the finally etched substrate 785) are estimated (e.g., from a model determined using prior processed substrates) at step 810. The second process apparatus may be a lithography tool. Thus, when a contribution of the etch tool crosses or meets a threshold (e.g., falls within a threshold range), the modification information may be created at step 820 for adjusting the one or more variables of the lithography tool based on the estimated contribution of the etch tool. Specifically, the one or more variables of the lithographic apparatus may include dose and/or focus. In an embodiment, when the contribution of the etch tool to the fingerprint is too large, e.g., falls out of a threshold range when considered in light of the contribution by the deposition tool and/or the lithography tool, the substrate that has been processed by the deposition tool (e.g., the patterned substrate 750) may be reworked rather than processed by the lithography tool.

Figure 9:
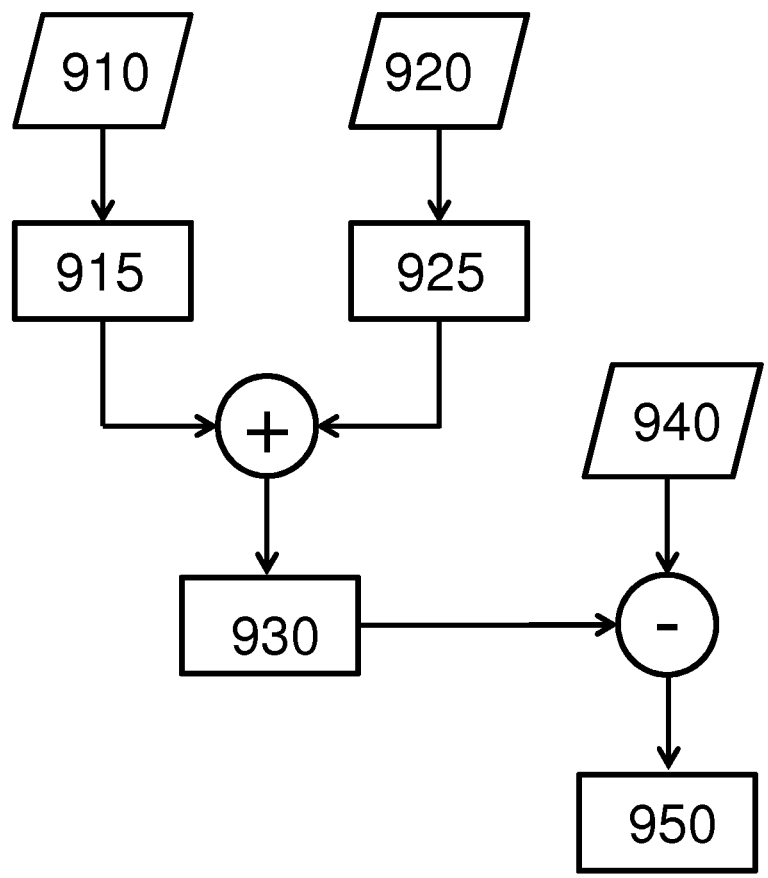
FIG. 9 depicts an example flow of a method to obtain a contribution of a non-lithography process apparatus to a characteristic of a substrate, according to an embodiment of the disclosure.

Referring to FIG. 9, an example flow of a method for determining a contribution of a post-lithography process apparatus (e.g., an etch tool) to a characteristic of a substrate is depicted. As shown, a contribution 915 of a pre-lithography process apparatus and a contribution 925 of a lithographic apparatus (e.g., the lithographic apparatus 630) to the characteristic of the substrate are obtained and combined at 930. While element 930 (and other similar elements in the Figures) shows a plus sign, the operation need not be addition, e.g., it can be a multiplication, convolution, etc. Further, the contribution 950 of a post-lithography process apparatus may be determined by removing from the characteristic 940 of the finally etched substrate 785 the combined contributions 930 of the pre-lithography process apparatus 915 and of the lithographic apparatus 925. While removing of the characteristic 940 (and other similar elements in the Figures) shows a negative sign, the operation need not be addition, e.g., it can be a division, deconvolution, etc. The values of the characteristic 940 of the finally etched substrate 785 are measured by a metrology apparatus (e.g., the metrology apparatus 650). Thus, in other words, the contribution 950 of a post-lithography process apparatus to the characteristic of the finally etched substrate 785 can be derived by removing (e.g., through subtraction, deconvolution, etc.) the contributions 915 and 925, of the pre-lithography process apparatus, and lithography process apparatus, respectively.

As described above, the contribution 915 of the deposition tool may be derived from a thickness 910 of the etchable layer formed by the deposition tool (e.g., the deposition tool 610). The contribution 925 of the lithographic apparatus may be derived from a group of one or more variables 920 related to the lithographic apparatus.

In an embodiment, the post-lithography process apparatus may comprise a development component of a track (e.g., the second track component 625), a bake plate component of the track (e.g., the second track component 625), and/or an etch tool (e.g., the etch tool 640). The pre-lithography process apparatus 915 may include a deposition tool (e.g., the deposition tool 610) and/or a resist coating component of a track (e.g., the first track component 620). As described above, the contribution of the track (e.g., the first track component 620 and/or the second track component 625) may be small, or even negligible, compared with the contribution of the deposition tool 610 and the contribution of the lithographic apparatus 630. Therefore, in an embodiment, the contribution 915 of the pre-lithography apparatus may refer only to the contribution of the deposition tool (e.g., the deposition tool 610), and the contribution 950 of the post-lithographic apparatus may refer only to the contribution of the etch tool (e.g., the etch tool 640).

Figure 10:
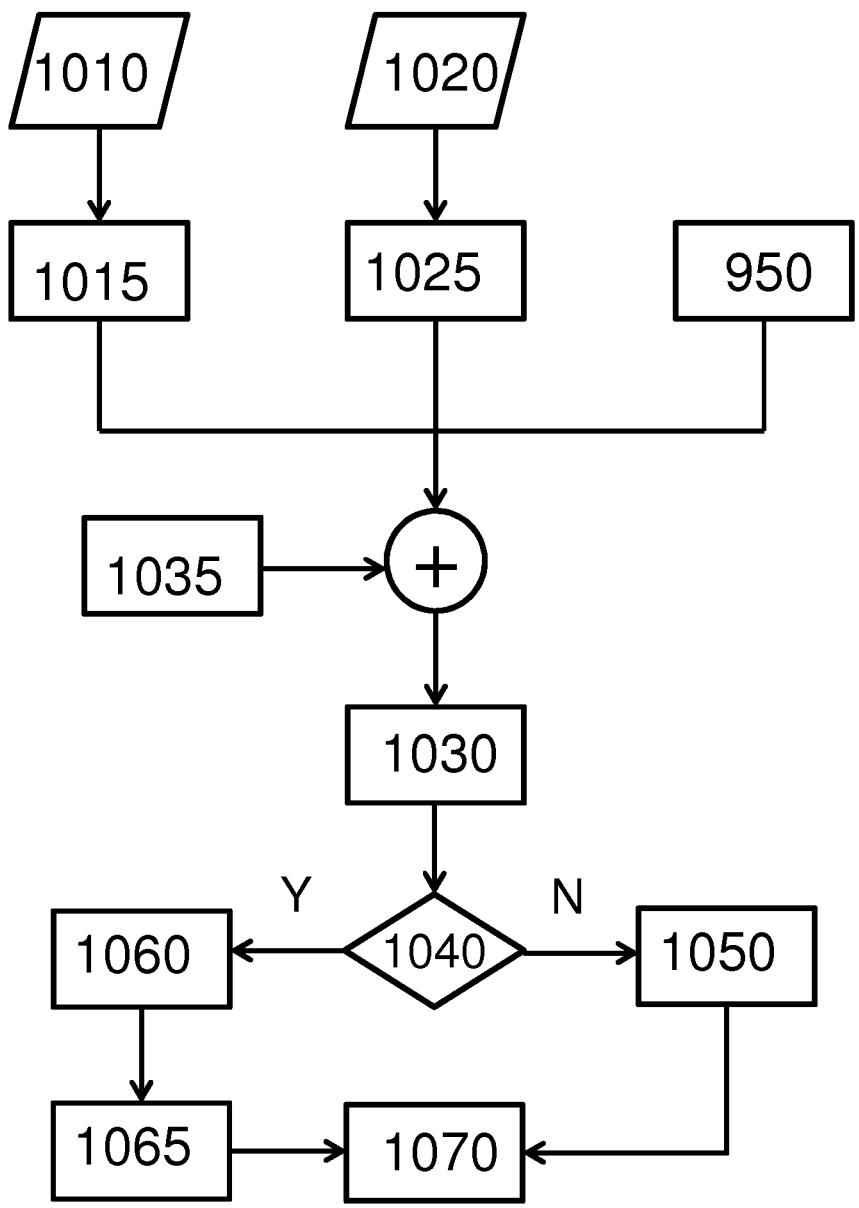
FIG. 10 depicts an example flow of a method to predict a defect or other error on a substrate, according to an embodiment of the disclosure.

Referring to FIG. 10, an example flow of a method to predict a defect or other error on a substrate and to adjust one or more variables of one or more process apparatuses is depicted. As shown, one or more characteristics 1030 that will be imparted to a substrate to be processed by one or more process apparatuses are estimated by combining one or more contributions (e.g., a first contribution 1015, a second contribution 1025, and a third contribution 950) specific to the one or more process apparatuses with a fourth contribution 1035 specific to a substrate being processed to obtain the one or more characteristics 1030, which is used to predict a defect or other error. In an embodiment, at least one of the one or more process apparatuses is upstream from the lithographic apparatus (i.e., a pre-lithography process apparatus).

In an embodiment, the one or more process apparatuses may include a deposition tool (e.g., the deposition tool 610), a lithographic apparatus (e.g., the lithographic apparatus 630), and an etch tool (e.g., the etch tool 640). Accordingly, a first contribution 1015 may be a contribution of the deposition tool (e.g., the deposition tool 610), a second contribution 1025 may be a contribution of the lithographic apparatus (e.g., the lithographic apparatus 630), and a third contribution 950 may be a contribution of the etch tool (e.g., the etch tool 640). In an embodiment, the one or more process apparatuses may further include one or more tracks (e.g., the first track component 620 and/or the second track component 625). Accordingly, the one or more contributions may include a contribution of the first track component 620 and/or the contribution of the second track component 625. As described above, however, the contribution of the first track component 620 and/or the contribution of the second track component 625 may be small, or even negligible, compared with the first contribution 1015 of the deposition tool, the second contribution 1025 of the lithographic apparatus, and the third contribution 950 of the etch tool. Therefore, in an embodiment, the contribution the first track component 620 and/or the contribution of the second track component 625 may be ignored.

As noted previously, the first contribution 1015 of the deposition tool (e.g., the deposition tool 610) may be derived from a variable (e.g., thickness) 1010 of an etchable layer formed in the substrate by the deposition tool (e.g., the deposition tool 610). In an embodiment, the first contribution 1015 is not specific to a particular substrate (and so can be used across substrates of the patterning process). In an embodiment, the first contribution 1015 is specific to a deposition chamber (e.g., the deposition chamber 611 or the deposition chamber 612) of the deposition tool (e.g., the deposition chamber 610) that is used to perform the deposition. Thus, in an embodiment, the first contribution 1015 of the deposition tool to the fingerprint 1030 may be pre-characterized and obtained from a database (e.g., the database 670) and moreover, may be obtained with reference to the deposition chamber (e.g., the deposition chamber 611 or the deposition chamber 612) of the deposition tool (e.g., the deposition tool 610) that is used in the deposition process.

The second contribution 1025 of the lithographic apparatus (e.g., the lithographic apparatus 630) may be derived from a group of one or more variables 1020 related to the lithographic apparatus. In an embodiment, the group of one or more variables 1020 related to the lithographic apparatus (e.g., the lithographic apparatus 630) may include one or more first variables non-specific to the substrate. Accordingly, at least a portion of the second contribution 1025 of the lithographic apparatus (e.g., the lithographic apparatus 630) may be derived from the one or more first variables that are non-specific to the particular substrate (and so can be used across substrates of the patterning process). Thus, the at least a portion of the second contribution 1025 may be pre-characterized and obtained from the database (e.g., the database 670). In an embodiment, the one or more first variables may include, but are not limited to, one or more of: one or more variables of illumination by the lithographic apparatus, one or more variables of a projection system of the lithographic apparatus, focus, dose, overlay, laser bandwidth, exposure duration, optical aberration, a high frequency laser bandwidth change, and/or a high frequency laser wavelength change.

In an embodiment, the third contribution 950 of the etch tool (e.g., the etch tool 640) may be obtained by the process as described in FIG. 9. The third contribution 950 of the etch tool may be pre-characterized by the process as previously described and obtained from a database (e.g., the database 670) and moreover, may be specific with reference to the etch chamber (e.g., the etch chamber 641 or etch chamber 642) of the etch tool (e.g., the etch tool 640) used for etching since the third contribution 950 of the etch tool may be specific to the etch chamber of the etch tool, and may be non-specific to the particular substrate (and so can be used across substrates of a patterning process).

In an embodiment, the fourth contribution 1035 of one or more process apparatuses is specific to one or more substrates for which defect or other error prediction is performed. In an embodiment, the fourth contribution 1035 is one or more variables related to the lithographic apparatus and specific to the one or more particular substrates for which prediction is performed. For example, the one or more variables of the lithographic apparatus specific to the substrate may include, but are not limited to, one or more of a MSD of movement of a substrate stage of the lithographic apparatus, a MA of movement of the substrate stage of the lithographic apparatus, and/or a focus. In an embodiment, the fourth contribution 1035 is one or more variables related to the deposition tool and specific to the one or more particular substrates for which prediction is performed. For example, the one or more variables of the deposition tool may be thickness.

At procedure 1040, it is determined whether one or more values of the characteristic (or characteristics) 1030 for the particular one or more substrates under consideration crosses or meets a threshold. If not, a defect or other error is not predicted to be produced on the one or more substrates at procedure 1050. The method is then finished at procedure 1070. Otherwise, a defect or other error is predicted to be produced on the one or more substrates at procedure 1060. At 1065, several options are possible. For example, where the one or more substrates are still being processed, a signal may be provided to discard the one or more substrates, rework the one or more substrate, etc. for which a defect or other error is predicted. Additionally or alternatively, modification information 1065 may be created to adjust one or more of the one or more process apparatuses based on the estimated characteristic. For example, where the one or more substrates are still being processed, the modification information may be created for a post-lithography apparatus where the fourth contribution 1035 is related to, e.g., the lithography apparatus. As a further example, the modification information may be created for processing of subsequent substrates to remedy the potential defect or other error. In an embodiment, the modification information 1065 may be created to adjust the one or more variables of the one or more process apparatuses. For example, the one or more variables may comprise one or more deposition variables of the deposition tool (e.g., the deposition tool 610), such as a deposition rate of the deposition tool and/or an operating duration of the deposition tool. For example, the one or more variables may comprise one or more lithography variables of the lithographic apparatus (e.g., the lithographic apparatus 630), such as a dose and/or a focus of the lithographic apparatus (e.g., the lithographic apparatus 630). For another example, the one or more variables may comprise one or more etch variables of the etch tool (e.g., the etch tool 640), such as an etch rate of the etch tool, an etch type of the etch tool, and/or an operating temperature of the etch tool. The method is then finished at procedure 1070.

Figure 11:
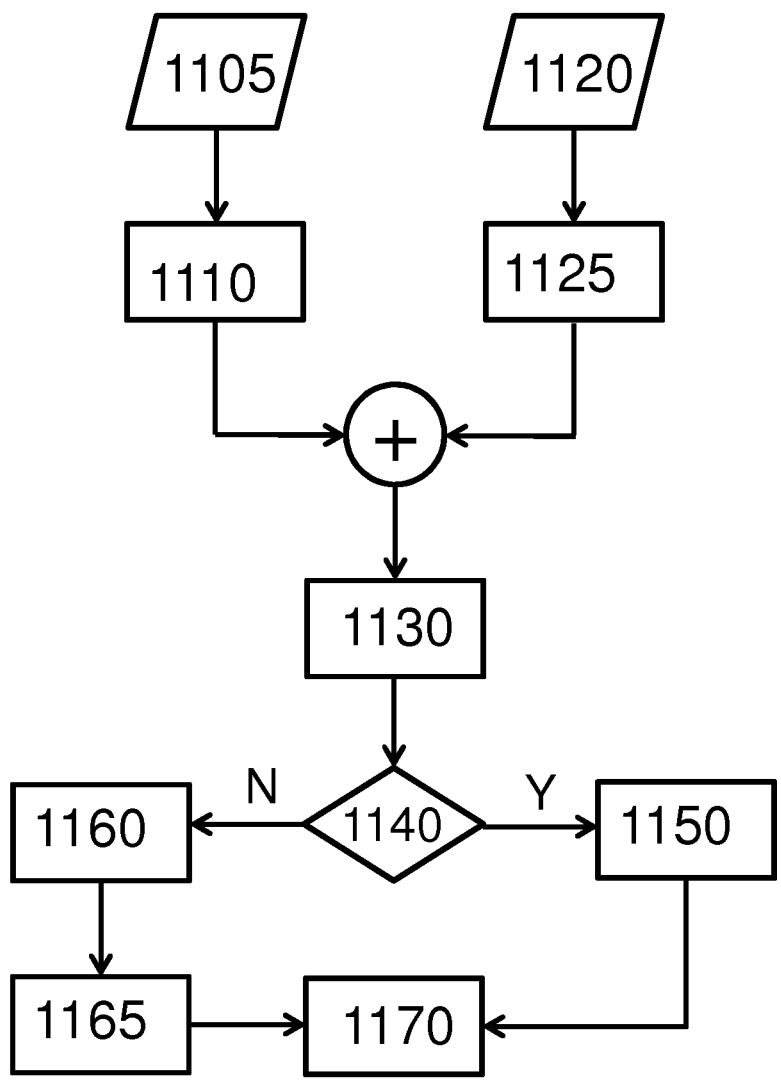
FIG. 11 depicts an example flow of a method to predict a defect or other error on a substrate, according to an embodiment of the disclosure.

Referring to FIG. 11, an example flow of a method to predict a defect or other error on a substrate is depicted. As shown, a characteristic that will be imparted to one or more substrates to be processed by one or more process apparatuses is estimated by combining a first contribution 1110 of a first group 1105 of one or more process variables of the one or more process apparatuses to the characteristic 1130 and a second contribution 1125 of a second group 1120 of one or more process variables of the one or more process apparatuses to the characteristic 1130. Specifically, the first contribution 1110 of the first group 1105 of one or more process variables may be non-specific to the one or more substrates for which a defect or other error is being predicted. Therefore, the first contribution 1110 may be pre-characterized based on the first group of one or more process variables and obtained from a database (e.g., the database 670). Similar to as discussed above, the contribution 1110 may be specific to certain one or more process apparatuses and/or components thereof (e.g., etch chambers).

The first group 1105 of one or more process variables may include the one or more deposition variables of the deposition tool, such as a deposition rate of the deposition tool and/or an operating duration of the deposition tool. In addition, the first group 1105 of one or more process variables may include one or more variables related to the lithographic apparatus that are non-specific to the substrate. For example, the one or more variables may include, but are not limited to, one or more of: one of more variables of illumination by the lithographic apparatus, one or more variables of a projection system of the lithographic apparatus, focus, dose, overlay, laser bandwidth, exposure duration, optical aberration, a high frequency laser bandwidth change, and/or a high frequency laser wavelength change. Further, the first group 1105 of one or more process variables may include one or more etch variables of the etch tool (e.g., the etch tool 640), such as an etch rate of the etch tool (specifically, an etch chamber of the etch tool), an etch type of the etch tool (specifically, the etch chamber of the etch tool), and/or an operating temperature of the etch tool (specifically, the etch chamber of the etch tool).

In an embodiment, the second group 1120 of one or more process variables of the one or more process apparatuses may include one or more variables related to the lithographic apparatus that are specific to the particular one or more substrates under consideration. For example, the one or more variables may include, but are not limited to, one or more: of a MSD of movement of a substrate stage of the lithographic apparatus, a MA of movement of the substrate stage of the lithographic apparatus, and/or a focus. In an embodiment, the second group 1120 of one or more process variables of the one or more process apparatuses may include one or more variables related to the deposition tool that are specific to the particular one or more substrates under consideration. For example, the one or more variables may include thickness.

At 1140, it is determined whether the estimated characteristic (or characteristics) 1130 crosses or meets a threshold. If so, no defect or other error is predicted to be produced on the substrate at 1150. The method is then finished at 1170. Otherwise, a defect or other error is predicted to be produced on the substrate at 1160. Similar steps as described above for FIG. 10 can be provided. For example, modification information 1165 may be created to adjust one or more process variables from the first group and/or the second group based on the estimated characteristic 1130. The method is then finished at 1170.

Figure 12:
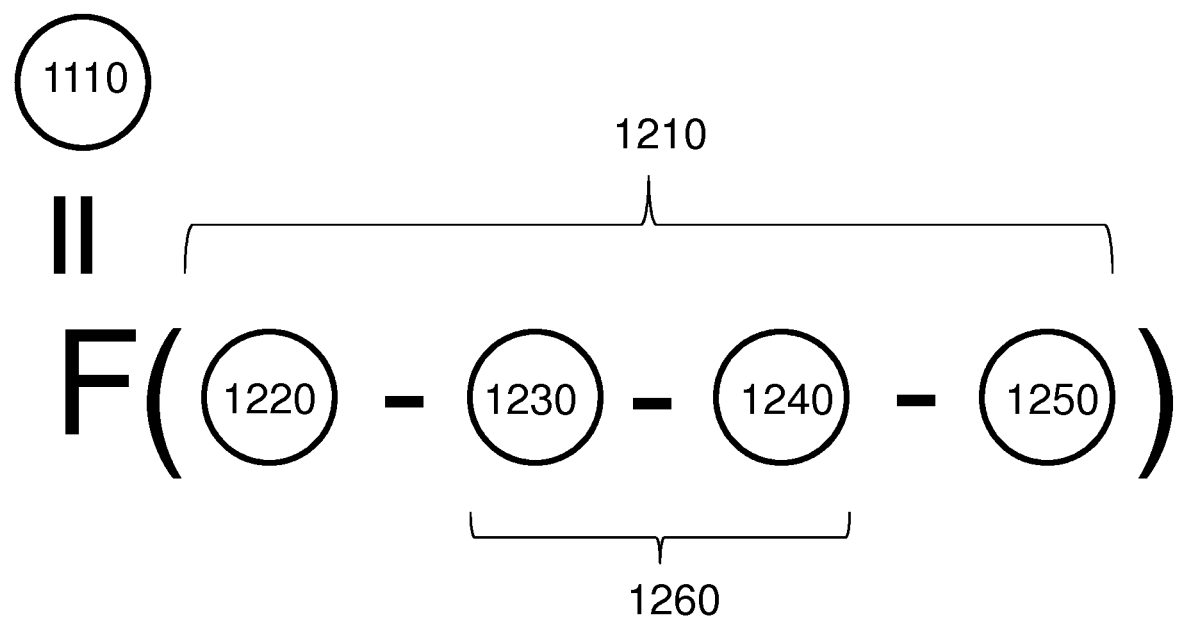
FIG. 12 schematically depicts an example of obtaining a contribution of an etch tool to a critical dimension uniformity of an etched substrate, according to an embodiment of the disclosure.

FIG. 12 depicts an example diagram of a method of determining the first contribution 1110 in terms of critical dimension uniformity of an etched substrate, according to an embodiment of the disclosure. As shown, the contribution 1110 to the critical dimension uniformity of the etched substrate (e.g., the finally etched substrate 785) may be obtained by removing, from a measured critical dimension uniformity of the etched substrate 1220, a contribution 1260 of the lithographic apparatus (e.g., the lithographic apparatus 630) to the critical dimension uniformity of the etched substrate, and the contribution 1250 of the deposition tool (e.g., the deposition tool 610) to the critical dimension uniformity of the etched substrate. As will be appreciated, the contribution 1110 can be determined by evaluating a plurality of substrates.

As noted above, in an embodiment, the contribution 1250 of the deposition tool may be based on a thickness of the deposition layer applied on the substrate by the deposition tool. In an embodiment, the contribution 1250 of the deposition tool may be pre-characterized and obtained from a database (e.g., the database 670) and moreover, may be specific to the deposition chamber (e.g., the deposition chamber 611 or the deposition chamber 612) of the deposition tool (e.g., the deposition tool 610) used for deposition. As described above, in an embodiment, the contribution 1250 can be determined by mathematical modeling using particular conditions (e.g., setup parameters of the deposition tool and/or data measured or otherwise provided by the deposition tool) for the deposition associated with the measured critical dimension uniformity of the etched substrate 1220.

In an embodiment, the contribution 1260 of the lithographic apparatus may be derived from a group of variables related to the lithographic apparatus. For example, the group of variables related to the lithographic apparatus may include focus and a moving standard deviation of movement of the substrate in the normal direction of the substrate. Accordingly, the contribution 1260 of the lithographic apparatus may include a first contribution 1230 to the critical dimension uniformity of the etched substrate derived from the focus of the lithographic apparatus, and a second contribution 1240 to the critical dimension uniformity of the etched substrate derived from the moving standard deviation of movement of the substrate in the normal direction of the substrate. In an embodiment, the group of variables related to the lithographic apparatus may include one or more other or additional variables. As described above, in an embodiment, the contribution 1260 can be determined by mathematical modeling using particular conditions (e.g., setup parameters of the lithographic apparatus and/or data measured or otherwise provided by the lithographic apparatus) for the pattern transfer by the lithographic apparatus associated with the measured critical dimension uniformity of the etched substrate 1220.

So, the contribution 1110 may be obtained by a function F of the contributions 1210 of one or more process apparatuses. In an embodiment, the contribution 1110 may be, or may be related to, a fingerprint of the one or more process apparatuses (e.g., the deposition tool, the lithographic apparatus and/or etch tool). In an embodiment, the function F may be a global fit function of the contributions 1210 using data for a plurality of substrates (e.g., fitted using a mathematical model, e.g., similar to equation (1) or (2) as noted above). In an embodiment, the contribution 1110 may indicate the non-correctable deviation or error of the one or more process apparatuses with respect to the critical dimension uniformity 1220 of the etched substrate. In an embodiment, the contribution 1110 may be stored in a database (e.g., the database 670). In some examples, the contribution 1110 (or other contributions) may be converted to a percentage of an average critical dimension value of one or more patterns across the etched substrate (e.g., the finally etched substrate 785) and then stored in the database (e.g., the database 670).

Figure 13:
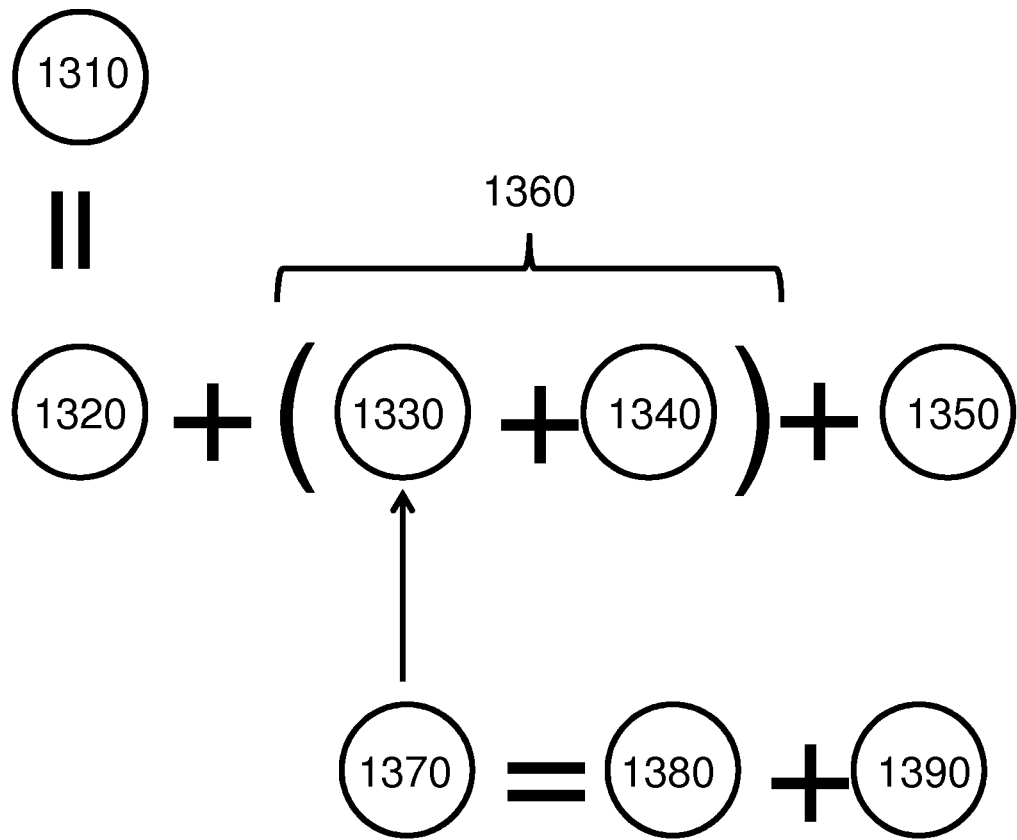
FIG. 13 schematically depicts an example of predicting a defect or other error on a substrate, according to an embodiment of the disclosure.

FIG. 13 depicts an example diagram of a method to predict a defect or other error on one or more substrates, according to an embodiment of the disclosure. As shown, a predicted critical dimension uniformity 1310 of a hot spot on an etched substrate (e.g., the finally etched substrate 785) is estimated by combining a contribution 1320 of one or more process apparatuses (such as contribution 1110, e.g., in the form of a fingerprint) to the critical dimension uniformity, a contribution 1360 of a lithographic apparatus to the critical dimension uniformity based on measured and/or tool data applicable to the one or more substrates, and a contribution 1350 of a deposition tool to the critical dimension uniformity based on measured and/or tool data applicable to the one or more substrates.

In an embodiment, the contribution 1350 of the deposition tool (e.g., the deposition tool 610) to the critical dimension uniformity may be characterized based on a thickness of an etchable layer (e.g., a deposition layer) applied by the deposition tool on the one or more substrates under consideration. In an embodiment, the contribution 1350 of the deposition tool may be determined using a mathematical model for the deposition tool and/or chamber. In an embodiment, the contribution 1350 of the deposition tool is determined based on measured data (e.g., measured thickness) and/or tool data (e.g., setup parameters, tool operation signals, etc.) applicable to the one or more substrates.

Figure 14:
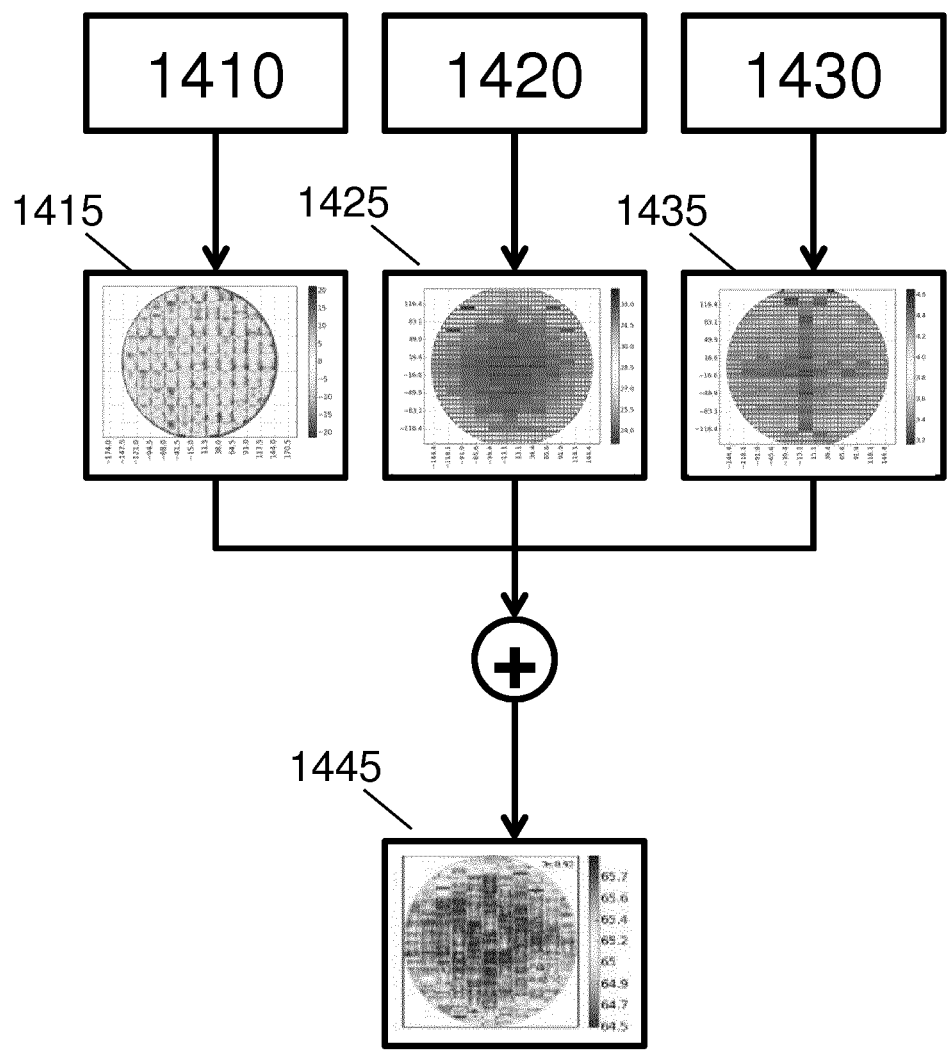
FIG. 14 schematically depicts an example of modeling a combined contribution of a lithographic apparatus to a characteristic of a substrate.

In an embodiment, the contribution 1360 of the lithographic apparatus may be derived from a group of variables related to the lithographic apparatus. For example, the group of variables related to the lithographic apparatus may include focus and a moving standard deviation of movement of the substrate in the normal direction of the substrate (although it could be further or different variables). Accordingly, the contribution 1360 of the lithographic apparatus may include a first contribution 1330 to the critical dimension uniformity of the etched substrate derived from focus 1370 of the lithographic apparatus, and a second contribution 1340 to the critical dimension uniformity of the etched substrate derived from moving standard deviation of movement of the substrate in the normal direction of the substrate. Specifically, the focus 1370 of the lithographic apparatus may be modeled by combining one or more first focus components 1380 that are non-specific to the one or more substrates under consideration and one or more second focus components 1390 that are specific to the one or more substrates under consideration. In an embodiment, the one or more first focus components 1380 may include, but are not limited to, a focus fingerprint of the lithographic apparatus. In an embodiment, the one or more second focus components 1390 may include, but are not limited to, a leveling and/or a servo parameter of the lithographic apparatus that affects the focus. In an embodiment, the combined contribution 1360 of the lithographic apparatus may be determined using a method e.g., as shown in FIG. 14. In an embodiment, the contribution 1360 may be determined using a mathematical model for the lithographic apparatus. In an embodiment, the contribution 1360 of the lithographic apparatus is determined based on measured data (e.g., measured height information for focus) and/or tool data (e.g., setup parameters, tool operation signals, etc.) applicable to the one or more substrates.

In an embodiment, the contribution 1320 (e.g., in the form of contribution 1110) may be determined as described in FIG. 12. The contribution 1320 may be obtained from the database (e.g., the database 670) and may be specific to the one or more process apparatuses used in obtaining the one or more substrates under consideration (e.g., specific to etch chamber of etch tool used in the etching of the one or more substrates under consideration).

After the critical dimension uniformity 1310 of the hot spot on the etched substrate is estimated, it may be determined whether a defect or other error will be produced at the hot spot based on the estimated critical dimension uniformity 1310. For example, if the estimated critical dimension uniformity 1310 meets or crosses a threshold, it may be determined that no defect or other error will be produced at the hot spot. Otherwise, it may be determined that a defect or other error will be produced at the hot spot. Appropriate action then may be taken such as a user signal, a rework/discard of a substrate, creation of modification information, etc.

FIG. 14 schematically shows an example of modeling a combined contribution to CD on a substrate, the contribution being of changes (e.g., errors) of multiple modelable processing variables such as focus (F) 1410, moving standard deviation ($MSD_z$) 1420 of movement of the substrate in the normal direction of the substrate, and moving standard deviation ($MSD_z$) 1430 of movement of the substrate in a direction parallel to the substrate. So, in this example, an example of the contribution to CD of focus (F) 1410 is shown as contribution 1415, an example of the contribution to CD of moving standard deviation ($MSD_z$) 1420 is shown as contribution 1425, and an example of the contribution to CD of moving standard deviation ($MSD_z$) 1430 is shown as contribution 1435. Each of these contributions is then combined together 1445. In an example, the combined contribution is expressed as $CD(x,y)=a_1*CD(F)^2(x,y)+b_1*CD(MSD_x)(x,y)+c_1*CD(MSD_z)(x,y)+\ldots$. In an embodiment, the contributions 1415, 1425, 1435 may be respectively focus (F) 1410, moving standard deviation ($MSD_z$) 1420 and moving standard deviation ($MSD_z$) 1430 distributions in which case a CD model would be used to combine them into a CD distribution. Moreover, there may be cross terms that are not shown here (such as CD as a function of F times MSD, etc.). To obtain an absolute value of CD, a nominal value or simulated value of the CD can be combined with the contributions. The coefficients such as $a_1$, $b_1$, $c_1$ are sensitivities of the metrology data CD with respect of the modelable processing variables or their functions. MSD is the moving standard deviation (MSD) of the positioning error of the substrate during pattern transfer in the lithographic apparatus and thus represents the high-frequency part of the positioning error. In this example, the contributions are across a substrate but in an embodiment, one or more of the contributions may per die/field (which could then be repeated across the substrate depending on, e.g., applicable conditions at each of the instances). The contribution (or its translation into an absolute value) may be characterized as a fingerprint since it can be spatially defined across the substrate/die/field. It should be noted that the method in FIG. 14 is not limited to model a contribution of a lithographic apparatus to a characteristic of a substrate. It may be used to model a combined contribution of any one or more variables related to the one or more process apparatuses in the manufacturing process to the characteristic of the processed substrate. The one or more variables may comprise one or more lithography variables, one or more deposition variables, one or more track variables, one or more etch variables, one or more planarization variables, etc.

In an embodiment, the contributions described herein may be specific to different particular portions of the patterning process, even within a same process apparatus. Thus, specific to a process apparatus or component encompasses such specificity as well.

In an embodiment, the contributions described herein are desirably determined per patterning process setup. Thus, in an embodiment, the contributions are determined for a particular combination of device pattern, device layers, etc. In an embodiment, the data herein is developed based on data measured using a metrology target associated with the device pattern of the patterning process. In an embodiment, the data herein is of device pattern itself.

In an embodiment, the contributions described herein are used in monitoring performance of one or more process apparatuses. That is, the contributions combined with current measured data can be used to determine current performance of the one or more process apparatuses (e.g., to identify whether there is drift). One or more actions can be taken responsive to analysis of the data from the combination, such as calibration/recalibration, creating modification information (e.g., for feedforward or feedback application), etc.

In an embodiment, one or more substrates patterned with one or more device patterns are used to determine the contributions. In an embodiment, one or more patterned monitor substrates are used to determine the contributions (e.g., the pattern can be a device pattern or another pattern correlated with the device pattern).

In an embodiment, the lithographic apparatus is monitored and/or controlled after exposure by a lithography baseliner using one or more monitor substrates. For example, one or more characteristics (e.g., critical dimension) of the monitor substrate may be measured to derive a measure of one or more variables of the lithographic substrate (e.g., focus, dose, etc.). If the measured value of the one or more characteristics and/or derived variables varies from a target value thereof (e.g., outside of a threshold range such as from a baseline setup), the lithography baseliner may adjust one or more variables (e.g., dose, focus, etc.) of the lithographic apparatus. In this manner, the lithographic apparatus may be monitored and/or controlled for drift, e.g., from a baseline of operation.

So, in an embodiment, there is can be provided a baseliner for one or more non-lithography process apparatuses (e.g., an etcher, a deposition chamber, a planarization tool, etc.) to enable matching (e.g., matching between different etchers, different deposition chambers, etc.), stability control (e.g., to monitor for drift), and/or monitoring of offsets/fingerprints. So, in an embodiment, CD after etch (e.g., on metrology targets using an optical inspection apparatus, measuring device patterns such as critical devices/hot spots using, e.g., electron beam inspection) is measured and then one or more fingerprints for the one or more process apparatuses are derived (e.g., per apparatus type). For example, lithographic apparatus focus and MSD fingerprints and a film thickness fingerprint measurements are used to isolate, e.g., an etch fingerprint of the etch tool. The one or more fingerprints can then be combined with per substrate measurement data to enable prediction and control (e.g., using lithographic apparatus dose corrections (e.g., based on a known dose sensitivity of the monitor feature or hotspot), an etch correction (etch rate, temperature changes (e.g., change of temperature in one or more zones, etc.) and/or film thickness change.

In an embodiment, there is provided a method, comprising: determining, by a hardware computer system, a contribution that one or more process apparatuses make to a characteristic of a substrate after the substrate has been processed according to a patterning process by the one or more process apparatuses by removing from values of the characteristic of the substrate a contribution of a lithography apparatus to the characteristic and a contribution of one or more pre-lithography process apparatuses to the characteristic.

In an embodiment, the one or more process apparatuses comprises an etch tool. In an embodiment, the contribution of the one or more pre-lithography process apparatuses to the characteristic comprises a contribution of a deposition tool to the characteristic. In an embodiment, the contribution of the deposition tool is derived from a characteristic of an etchable layer of the substrate formed by the deposition tool. In an embodiment, the characteristic of the etchable layer is a thickness of the etchable layer. In an embodiment, the contribution of the lithographic apparatus to the characteristic is derived from a group of one or more variables related to the lithographic apparatus. In an embodiment, the one or more first variables comprise one or more selected from: one or more variables of illumination by the lithographic apparatus, one or more variables of a projection system of the lithographic apparatus, focus, dose, overlay, a moving standard deviation of movement of a substrate stage of the lithographic apparatus, a moving average of movement of a substrate stage of the lithographic apparatus, laser bandwidth, exposure duration, optical aberration, a high frequency laser bandwidth change, and/or a high frequency laser wavelength change. In an embodiment, the method further comprises: determining using the contribution of the one or more process apparatuses whether the characteristic for one or more substrate under consideration meets or crosses a threshold; and responsive to a determination in relation to the threshold, creating and outputting modification information to adjust the one or more pre-lithography process apparatuses, the lithography apparatus, and/or one or more post-lithography process apparatuses. In an embodiment, the modification information is used to modify a variable of the one or more pre-lithography process apparatuses, the lithography apparatus, and/or the one or more post-lithography process apparatuses, and wherein the variable comprises a deposition variable of a deposition tool, a lithography variable of a lithographic apparatus, and/or an etch variable of an etch tool. In an embodiment, the variable comprises the deposition variable of the deposition tool, the deposition variable comprising a deposition rate of the deposition tool or an operating duration of the deposition tool. In an embodiment, the variable comprises the lithography variable of the lithographic apparatus, the lithography variable comprising one or more variables of illumination by the lithographic apparatus, one or more variables of a projection system of the lithographic apparatus, focus, dose, overlay, a moving standard deviation of movement of a substrate stage of the lithographic apparatus, a moving average of movement of a substrate stage of the lithographic apparatus, laser bandwidth, exposure duration, optical aberration, a high frequency laser bandwidth change, and/or a high frequency laser wavelength change. In an embodiment, the variable comprises the etch variable of the etch tool, the etch variable comprising an etch type of the etch tool and/or an etch rate of the etch tool. In an embodiment, the creating modification information comprises creating modification information to adjust a variable of a first component and/or a second component of a post-lithography process apparatus. In an embodiment, the post-lithography process apparatus is an etch tool, the first component is a first etch chamber of the etch tool, the second component is a second etch chamber of the etch tool, and the variable of the first component and/or the second component comprises an etch rate of the first etch chamber of the etch tool and/or the second etch chamber of the etch tool, an etch type of the first etch chamber of the etch tool and/or the second etch chamber of the etch tool, or an operating temperature of the first etch chamber of the etch tool and/or the second etch chamber of the etch tool. In an embodiment, the one or more substrates have been processed by a first chamber of the one or more process apparatuses, and the modification information causes one or more values of the characteristic for the one or more substrates processed by the first chamber and one or more values of the characteristic for one or more substrates processed by a second chamber of the one or more process apparatuses to more closely match. In an embodiment, the values of the characteristic of the substrate are obtained by measuring one or more metrology targets on the substrate with a metrology apparatus. In an embodiment, the characteristic of the substrate comprises one or more characteristics selected from: critical dimension, critical dimension uniformity, overlay, side wall angle, bottom surface tilt, feature height, pattern shift, and/or geometric asymmetry of a pattern. In an embodiment, the characteristic of the substrate comprises one or more fingerprints of the characteristic across a pattern on the substrate, or one or more fingerprints of the characteristic across the substrate containing a plurality of the patterns across the substrate.

In an embodiment, there is provided a method, comprising: estimating, by a hardware computer system, a characteristic that will be imparted to a substrate to be processed by a patterning process by combining a contribution specific to the substrate of a first group of one or more process variables related to one or more process apparatuses used in the patterning process and a contribution non-specific to the substrate of a second group of one or more process variables related to the one or more process apparatuses, at least one process variable from the first group and/or the second group being related to a process apparatus upstream from a lithographic apparatus In an embodiment, the method further comprises determining whether a defect or other error is to be produced on the substrate based on the estimated characteristic. In an embodiment, the method further comprises creating modification information to adjust one or more process variables from the first group and/or the second group based on the estimated characteristic. In an embodiment, the second group of one or more process variables comprises one or more variables related to a deposition tool, a lithographic apparatus, and/or an etch tool. In an embodiment, the second group of one or more process variables comprises a deposition rate of the deposition tool or an operating duration of the deposition tool. In an embodiment, the second group of one or more process variables comprises one or more variables selected from: one or more variables related to illumination by the lithographic apparatus, one or more variables of a projection system of the lithographic apparatus, focus, dose, overlay, laser bandwidth, exposure duration, optical aberration, a high frequency laser bandwidth change, and/or a high frequency laser wavelength change. In an embodiment, the second group of one or more process variables comprise an etch rate of an etch tool, an etch type of an etch tool, or an operating temperature of the etch tool. In an embodiment, the first group of one or more process variables comprises one or more variables related to a lithographic apparatus. In an embodiment, the one or more variables related to a lithographic apparatus comprises a moving standard deviation of movement of a substrate stage of the lithographic apparatus, or a moving average of movement of a substrate stage of the lithographic apparatus. In an embodiment, the characteristic of the substrate comprises one or more characteristics selected from: critical dimension, critical dimension uniformity, overlay, side wall angle, feature height, bottom surface tilt, pattern shift, and/or geometric asymmetry of a pattern. In an embodiment, the characteristic of the substrate comprises one or more fingerprints of the characteristic across a pattern on the substrate, or one or more fingerprints of the characteristic across the substrate containing a plurality of the patterns across the substrate.

In an embodiment, there is provided a method, comprising: estimating, by a hardware computer system, a characteristic that will be imparted to a substrate to be processed by one or more process apparatuses by combining one or more contributions to the characteristic of the one or more process apparatuses with one or more values of the characteristic, at least one of the one or more process apparatuses being upstream from a lithographic apparatus.

In an embodiment, the method further comprises determining whether a defect is to be produced on the substrate based on the estimated characteristic. In an embodiment, the one or more process apparatuses comprise one or more selected from: a deposition tool, a lithographic apparatus, and/or an etch tool. In an embodiment, the one or more contributions of the one or more process apparatuses to the characteristic comprise a contribution of a deposition tool to the characteristic. In an embodiment, the contribution of the deposition tool to the characteristic is derived from a characteristic of an etchable layer formed in the substrate by the deposition tool. In an embodiment, the characteristic of the etchable layer is a thickness of the etchable layer. In an embodiment, the one or more contributions of the one or more process apparatuses to the characteristic comprise a contribution of a lithographic apparatus to the characteristic. In an embodiment, the contribution of the lithographic apparatus to the characteristic is derived from a group of one or more variables related to the lithographic apparatus. In an embodiment, the one or more variables related to the lithographic apparatus comprise one or more variables selected from: one or more variables of illumination by the lithographic apparatus, one or more variables of a projection system of the lithographic apparatus, focus, dose, overlay, a moving standard deviation of movement of a substrate stage of the lithographic apparatus, a moving average of movement of a substrate stage of the lithographic apparatus, laser bandwidth, exposure duration, optical aberration, a high frequency laser bandwidth change, and/or a high frequency laser wavelength change. In an embodiment, the one or more contributions of the one or more process apparatuses to the characteristic comprise a contribution of an etch tool to the characteristic. In an embodiment, the method further comprises creating and outputting modification information to adjust one or more of the one or more process apparatuses based on the estimated characteristic. In an embodiment, the modification information is used to modify one or more variables of the one or more of the one or more process apparatuses. In an embodiment, the one or more variables comprise a deposition variable of a deposition tool, a lithography variable of a lithographic apparatus, and/or an etch variable of an etch tool. In an embodiment, the one or more variables comprise the deposition variable of the deposition tool, the deposition variable comprising a deposition rate of the deposition tool or an operating duration of the deposition tool. In an embodiment, the one or more variables comprise the lithography variable of the lithographic apparatus, the lithography variable comprising one or more variables of illumination by the lithographic apparatus, one or more variables of a projection system of the lithographic apparatus, focus, dose, overlay, a moving standard deviation of movement of a substrate stage of the lithographic apparatus, a moving average of movement of a substrate stage of the lithographic apparatus, laser bandwidth, exposure duration, optical aberration, a high frequency laser bandwidth change, and/or a high frequency laser wavelength change. In an embodiment, the one or more variables comprise the etch variable of the etch tool, the etch variable comprising an etch rate of the etch tool, an etch type of the etch tool, or an operating temperature of the etch tool. In an embodiment, the one or more values of the characteristic of the substrate are determined from a measurement or a signal from one or more of the one or more process apparatuses. In an embodiment, the characteristic of the substrate comprises one or more characteristics selected from: critical dimension, critical dimension uniformity, overlay, side wall angle, feature height, bottom surface tilt, pattern shift, and/or geometric asymmetry of a pattern. In an embodiment, the characteristic of the substrate comprises one or more fingerprints of the characteristic across a pattern on the substrate, or one or more fingerprints of the characteristic across the substrate containing a plurality of the patterns across the substrate.

In an embodiment, there is provided a method, comprising: determining one or more contributions of one or more first process apparatuses to a characteristic of a substrate; and creating, by a hardware computer system and based at least in part on the one or more contributions, modification information to adjust one or more second process apparatuses downstream from the one or more first process apparatuses.

In an embodiment, at least one of the one or more first process apparatuses is upstream from a lithographic apparatus. In an embodiment, the one or more first process apparatuses comprise a deposition tool. In an embodiment, the one or more second process apparatuses comprise a lithographic apparatus and/or an etch tool. In an embodiment, the one or more contributions of the one or more first process apparatuses to the characteristic comprise a contribution of the deposition tool to the characteristic. In an embodiment, the contribution of the deposition tool to the characteristic is derived from a characteristic of an etchable layer formed in the substrate by the deposition tool. In an embodiment, the characteristic of the etchable layer is a thickness of the etchable layer. In an embodiment, the modification information is used to modify a variable of the one or more second process apparatuses. In an embodiment, the variable comprises a lithography variable of a lithographic apparatus. In an embodiment, the variable comprises an etch variable of the etch tool. In an embodiment, the characteristic of the substrate comprises one or more characteristics selected from: critical dimension, critical dimension uniformity, overlay, side wall angle, feature height, bottom surface tilt, pattern shift, and/or geometric asymmetry of a pattern. In an embodiment, the characteristic of the substrate comprises one or more fingerprints of the characteristic across a pattern on the substrate, or one or more fingerprints of the characteristic across the substrate containing a plurality of the patterns across the substrate.

While discussion in this application will consider an embodiment in relation to a metrology process and metrology target designed to measure overlay between one or more layers of a device being formed on a substrate, the embodiments herein are equally applicable to other metrology processes and targets, such as process and targets to measure alignment (e.g., between a patterning device and a substrate), process and targets to measure critical dimension, etc. Accordingly, the references herein to overlay metrology targets, overlay data, etc. should be considered as suitably modified to enable other kinds of metrology processes and targets.

Figure 15:
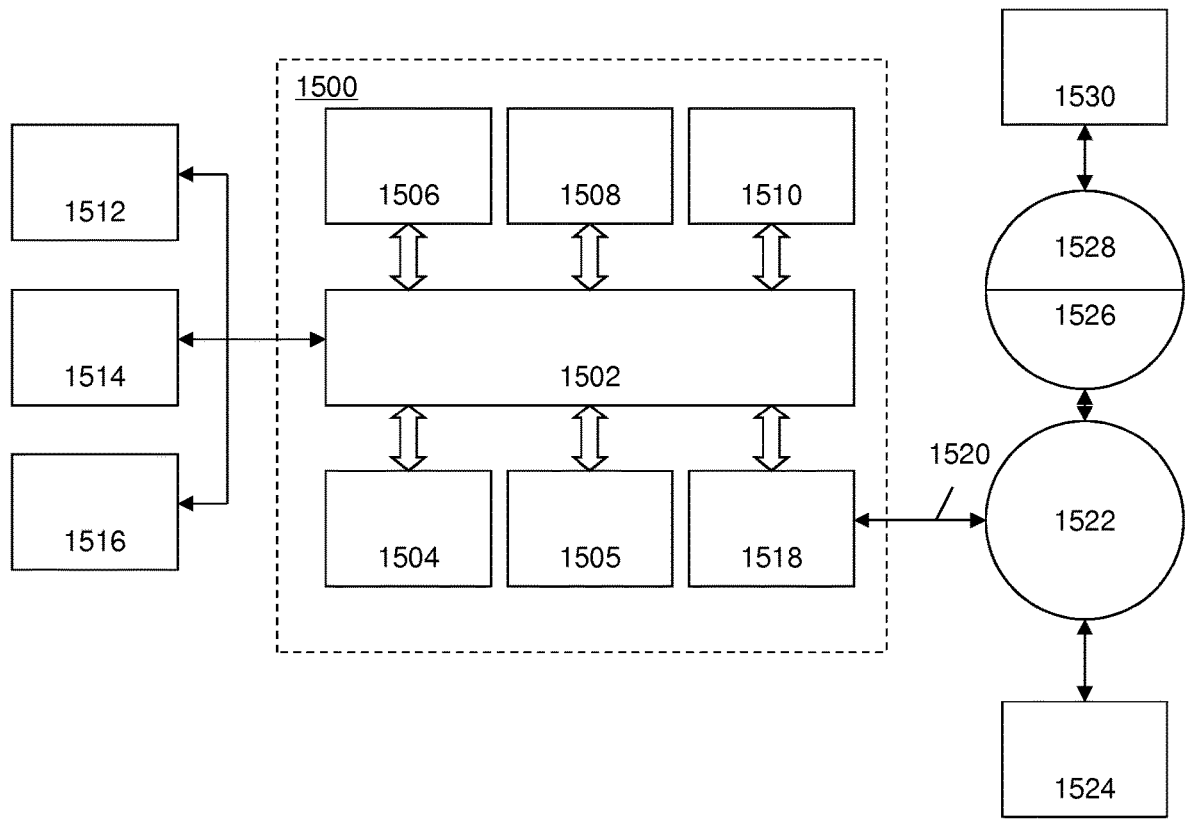
FIG. 15 schematically depicts a computer system which may implement embodiments of this disclosure.

Referring to FIG. 15, a computer system 1500 is shown. The computer system 1500 includes a bus 1502 or other communication mechanism for communicating information, and a processor 1504 (or multiple processors 1504 and 1505) coupled with bus 1502 for processing information. Computer system 1500 also includes a main memory 1506, such as a random access memory (RAM) or other dynamic storage device, coupled to bus 1502 for storing information and instructions to be executed by processor 1504. Main memory 1506 also may be used for storing temporary variables or other intermediate information during execution of instructions to be executed by processor 1504. Computer system 1500 further includes a read only memory (ROM) 1508 or other static storage device coupled to bus 1502 for storing static information and instructions for processor 1504. A storage device 1510, such as a magnetic disk or optical disk, is provided and coupled to bus 1502 for storing information and instructions.

Computer system 1500 may be coupled via bus 1502 to a display 1512, such as a cathode ray tube (CRT) or flat panel or touch panel display for displaying information to a computer user. An input device 1514, including alphanumeric and other keys, is coupled to bus 1502 for communicating information and command selections to processor 1504. Another type of user input device is cursor control 1516, such as a mouse, a trackball, or cursor direction keys for communicating direction information and command selections to processor 1504 and for controlling cursor movement on display 1512. This input device typically has two degrees of freedom in two axes, a first axis (e.g., x) and a second axis (e.g., y), that allows the device to specify positions in a plane. A touch panel (screen) display may also be used as an input device.

The computer system 1500 may be suitable to function as the software application 660 in FIG. 6 in response to processor 1504 executing one or more sequences of one or more instructions contained in main memory 1506. Such instructions may be read into main memory 1506 from another computer-readable medium, such as storage device 1510. Execution of the sequences of instructions contained in main memory 1506 causes processor 1504 to perform the process implemented by the software application 660 as described herein. One or more processors in a multi-processing arrangement may also be employed to execute the sequences of instructions contained in main memory 1506. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 1504 for execution. Such a medium may take many forms, including but not limited to, non-volatile media, volatile media, and transmission media. Non-volatile media include, for example, optical or magnetic disks, such as storage device 1510. Volatile media include dynamic memory, such as main memory 1506. Transmission media include coaxial cables, copper wire and fiber optics, including the wires that comprise bus 1502. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1504 for execution. For example, the instructions may initially be borne on a magnetic disk of a remote computer. The remote computer can load the instructions into its dynamic memory and send the instructions over a telephone line using a modem. A modem local to computer system 1500 can receive the data on the telephone line and use an infrared transmitter to convert the data to an infrared signal. An infrared detector coupled to bus 1502 can receive the data carried in the infrared signal and place the data on bus 1502. Bus 1502 carries the data to main memory 1506, from which processor 1504 retrieves and executes the instructions. The instructions received by main memory 1506 may optionally be stored on storage device 1510 either before or after execution by processor 1504.

Computer system 1500 may also include a communication interface 1518 coupled to bus 1502. Communication interface 1518 provides a two-way data communication coupling to a network link 1520 that is connected to a local network 1522. For example, communication interface 1518 may be an integrated services digital network (ISDN) card or a modem to provide a data communication connection to a corresponding type of telephone line. As another example, communication interface 1518 may be a local area network (LAN) card to provide a data communication connection to a compatible LAN. Wireless links may also be implemented. In any such implementation, communication interface 1518 sends and receives electrical, electromagnetic or optical signals that carry digital data streams representing various types of information.

Network link 1520 typically provides data communication through one or more networks to other data devices. For example, network link 1520 may provide a connection through local network 1522 to a host computer 1524 or to data equipment operated by an Internet Service Provider (ISP) 1526. ISP 1526 in turn provides data communication services through the worldwide packet data communication network, now commonly referred to as the "Internet" 1528. Local network 1522 and Internet 1528 both use electrical, electromagnetic or optical signals that carry digital data streams. The signals through the various networks and the signals on network link 1520 and through communication interface 1518, which carry the digital data to and from computer system 1500, are exemplary forms of carrier waves transporting the information.

Computer system 1500 can send messages and receive data, including program code, through the network(s), network link 1520, and communication interface 1518. In the Internet example, a server 1530 might transmit a requested code for an application program through Internet 1528, ISP 1526, local network 1522 and communication interface 1518. In accordance with one or more embodiments, one such downloaded application provides for a method as disclosed herein, for example. The received code may be executed by processor 1504 as it is received, and/or stored in storage device 1510, or other non-volatile storage for later execution. In this manner, computer system 1500 may obtain application code in the form of a carrier wave.

An embodiment of the disclosure may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs. Although specific reference may be made in this text to the use of inspection apparatus in the manufacture of ICs, it should be understood that the inspection apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Further embodiments of the invention are disclosed in the list of numbered clauses below:

1. A method, comprising:
   determining, by a hardware computer system, a contribution that one or more process apparatuses make to a characteristic of a substrate after the substrate has been processed according to a patterning process by the one or more process apparatuses by removing from values of the characteristic of the substrate a contribution of a lithography apparatus to the characteristic and a contribution of one or more pre-lithography process apparatuses to the characteristic.

2. The method of clause 1, wherein the one or more process apparatuses comprises an etch tool.

3. The method of clause 1 or clause 2, wherein the contribution of the one or more pre-lithography process apparatuses to the characteristic comprises a contribution of a deposition tool to the characteristic.

4. The method of clause 3, wherein the contribution of the deposition tool is derived from a characteristic of an etchable layer of the substrate formed by the deposition tool.

5. The method of clause 4, wherein the characteristic of the etchable layer is a thickness of the etchable layer.

6. The method of any of clauses 1-5, wherein the contribution of the lithographic apparatus to the characteristic is derived from a group of one or more variables related to the lithographic apparatus.

7. The method of clause 6, wherein the one or more first variables comprise one or more selected from: one or more variables of illumination by the lithographic apparatus, one or more variables of a projection system of the lithographic apparatus, focus, dose, overlay, a moving standard deviation of movement of a substrate stage of the lithographic apparatus, a moving average of movement of a substrate stage of the lithographic apparatus, laser bandwidth, exposure duration, optical aberration, a high frequency laser bandwidth change, and/or a high frequency laser wavelength change.

8. The method of any of clauses 1-7, further comprising:
   determining using the contribution of the one or more process apparatuses whether the characteristic for one or more substrate under consideration meets or crosses a threshold; and
   responsive to a determination in relation to the threshold, creating and outputting modification information to adjust the one or more pre-lithography process apparatuses, the lithography apparatus, and/or one or more post-lithography process apparatuses.

9. The method of clause 8, wherein the modification information is used to modify a variable of the one or more pre-lithography process apparatuses, the lithography apparatus, and/or the one or more post-lithography process apparatuses, and wherein the variable comprises a deposition variable of a deposition tool, a lithography variable of a lithographic apparatus, and/or an etch variable of an etch tool.

10. The method of clause 9, wherein the variable comprises the deposition variable of the deposition tool, the deposition variable comprising a deposition rate of the deposition tool or an operating duration of the deposition tool.

11. The method of clause 9 or clause 10, wherein the variable comprises the lithography variable of the lithographic apparatus, the lithography variable comprising one or more variables of illumination by the lithographic apparatus, one or more variables of a projection system of the lithographic apparatus, focus, dose, overlay, a moving standard deviation of movement of a substrate stage of the lithographic apparatus, a moving average of movement of a substrate stage of the lithographic apparatus, laser bandwidth, exposure duration, optical aberration, a high frequency laser bandwidth change, and/or a high frequency laser wavelength change.

12. The method of any of clauses 9-11, wherein the variable comprises the etch variable of the etch tool, the etch variable comprising an etch type of the etch tool and/or an etch rate of the etch tool.

13. The method of any of clauses 8-12, wherein the creating modification information comprises creating modification information to adjust a variable of a first component and/or a second component of a post-lithography process apparatus.

14. The method of clause 13, wherein the post-lithography process apparatus is an etch tool, the first component is a first etch chamber of the etch tool, the second component is a second etch chamber of the etch tool, and the variable of the first component and/or the second component comprises an etch rate of the first etch chamber of the etch tool and/or the second etch chamber of the etch tool, an etch type of the first etch chamber of the etch tool and/or the second etch chamber of the etch tool, or an operating temperature of the first etch chamber of the etch tool and/or the second etch chamber of the etch tool.

15. The method of any of clauses 8-14, wherein the one or more substrates have been processed by a first chamber of the one or more process apparatuses, and the modification information causes one or more values of the characteristic for the one or more substrates processed by the first chamber and one or more values of the characteristic for one or more substrates processed by a second chamber of the one or more process apparatuses to more closely match.

16. The method of any of clauses 1-15, wherein the values of the characteristic of the substrate are obtained by measuring one or more metrology targets on the substrate with a metrology apparatus.

17. The method of any of clauses 1-16, wherein the characteristic of the substrate comprises one or more characteristics selected from: critical dimension, critical dimension uniformity, overlay, side wall angle, bottom surface tilt, feature height, pattern shift, and/or geometric asymmetry of a pattern.

18. The method of clause 17, wherein the characteristic of the substrate comprises one or more fingerprints of the characteristic across a pattern on the substrate, or one or more fingerprints of the characteristic across the substrate containing a plurality of the patterns across the substrate.

19. A method, comprising:
estimating, by a hardware computer system, a characteristic that will be imparted to a substrate to be processed by a patterning process by combining a contribution specific to the substrate of a first group of one or more process variables related to one or more process apparatuses used in the patterning process and a contribution non-specific to the substrate of a second group of one or more process variables related to the one or more process apparatuses, at least one process variable from the first group and/or the second group being related to a process apparatus upstream from a lithographic apparatus.

20. The method of clause 19, further comprising determining whether a defect or other error is to be produced on the substrate based on the estimated characteristic.

21. The method of clause 19 or clause 20, further comprising creating modification information to adjust one or more process variables from the first group and/or the second group based on the estimated characteristic.

22. The method of any of clauses 19-21, wherein the second group of one or more process variables comprises one or more variables related to a deposition tool, a lithographic apparatus, and/or an etch tool.

23. The method of clause 22, wherein the second group of one or more process variables comprises a deposition rate of the deposition tool or an operating duration of the deposition tool.

24. The method of clause 22 or clause 23, wherein the second group of one or more process variables comprises one or more variables selected from: one or more variables related to illumination by the lithographic apparatus, one or more variables of a projection system of the lithographic apparatus, focus, dose, overlay, laser bandwidth, exposure duration, optical aberration, a high frequency laser bandwidth change, and/or a high frequency laser wavelength change.

25. The method of any of clauses 22-24, wherein the second group of one or more process variables comprise an etch rate of an etch tool, an etch type of an etch tool, or an operating temperature of the etch tool.

26. The method of any of clauses 19-25, wherein the first group of one or more process variables comprises one or more variables related to a lithographic apparatus.

27. The method of clause 26, wherein the one or more variables related to a lithographic apparatus comprises a moving standard deviation of movement of a substrate stage of the lithographic apparatus, or a moving average of movement of a substrate stage of the lithographic apparatus.

28. The method of any of clauses 19-27, wherein the characteristic of the substrate comprises one or more characteristics selected from: critical dimension, critical dimension uniformity, overlay, side wall angle, feature height, bottom surface tilt, pattern shift, and/or geometric asymmetry of a pattern.

29. The method of clause 28, wherein the characteristic of the substrate comprises one or more fingerprints of the characteristic across a pattern on the substrate, or one or more fingerprints of the characteristic across the substrate containing a plurality of the patterns across the substrate.

30. A method, comprising:
estimating, by a hardware computer system, a characteristic that will be imparted to a substrate to be processed by one or more process apparatuses by combining one or more contributions to the characteristic of the one or more process apparatuses with one or more values of the characteristic, at least one of the one or more process apparatuses being upstream from a lithographic apparatus.

31. The method of clause 30, further comprising determining whether a defect is to be produced on the substrate based on the estimated characteristic.

32. The method of clause 30 or clause 31, wherein the one or more process apparatuses comprise one or more selected from: a deposition tool, a lithographic apparatus, and/or an etch tool.

33. The method of any of clauses 30-32, wherein the one or more contributions of the one or more process apparatuses to the characteristic comprise a contribution of a deposition tool to the characteristic.

34. The method of clause 33, wherein the contribution of the deposition tool to the characteristic is derived from a characteristic of an etchable layer formed in the substrate by the deposition tool.

35. The method of clause 34, wherein the characteristic of the etchable layer is a thickness of the etchable layer.

36. The method of any of clauses 30-35, wherein the one or more contributions of the one or more process apparatuses to the characteristic comprise a contribution of a lithographic apparatus to the characteristic.

37. The method of clause 36, wherein the contribution of the lithographic apparatus to the characteristic is derived from a group of one or more variables related to the lithographic apparatus.

38. The method of clause 37, wherein the one or more variables related to the lithographic apparatus comprise one or more variables selected from: one or more variables of illumination by the lithographic apparatus, one or more variables of a projection system of the lithographic apparatus, focus, dose, overlay, a moving standard deviation of movement of a substrate stage of the lithographic apparatus, a moving average of movement of a substrate stage of the lithographic apparatus, laser bandwidth, exposure duration, optical aberration, a high frequency laser bandwidth change, and/or a high frequency laser wavelength change.

39. The method of any of clauses 30-38, wherein the one or more contributions of the one or more process apparatuses to the characteristic comprise a contribution of an etch tool to the characteristic.

40. The method of any of clauses 30-39, further comprising creating and outputting modification information to adjust one or more of the one or more process apparatuses based on the estimated characteristic.

41. The method of clause 40, wherein the modification information is used to modify one or more variables of the one or more of the one or more process apparatuses.

42. The method of clause 41, wherein the one or more variables comprise a deposition variable of a deposition tool, a lithography variable of a lithographic apparatus, and/or an etch variable of an etch tool.

43. The method of clause 42, wherein the one or more variables comprise the deposition variable of the deposition tool, the deposition variable comprising a deposition rate of the deposition tool or an operating duration of the deposition tool.

44. The method of clauses 42 or clause 43, wherein the one or more variables comprise the lithography variable of the lithographic apparatus, the lithography variable comprising one or more variables of illumination by the lithographic apparatus, one or more variables of a projection system of the lithographic apparatus, focus, dose, overlay, a moving standard deviation of movement of a substrate stage of the lithographic apparatus, a moving average of movement of a substrate stage of the lithographic apparatus, laser bandwidth, exposure duration, optical aberration, a high frequency laser bandwidth change, and/or a high frequency laser wavelength change.

45. The method of any of clauses 42-44, wherein the one or more variables comprise the etch variable of the etch tool, the etch variable comprising an etch rate of the etch tool, an etch type of the etch tool, or an operating temperature of the etch tool.

46. The method of any of clauses 30-45, wherein the one or more values of the characteristic of the substrate are determined from a measurement or a signal from one or more of the one or more process apparatuses.

47. The method of any of clauses 30-46, wherein the characteristic of the substrate comprises one or more characteristics selected from: critical dimension, critical dimension uniformity, overlay, side wall angle, feature height, bottom surface tilt, pattern shift, and/or geometric asymmetry of a pattern.

48. The method of clause 47, wherein the characteristic of the substrate comprises one or more fingerprints of the characteristic across a pattern on the substrate, or one or more fingerprints of the characteristic across the substrate containing a plurality of the patterns across the substrate.

49. A method, comprising:
    determining one or more contributions of one or more first process apparatuses to a characteristic of a substrate; and
    creating, by a hardware computer system and based at least in part on the one or more contributions, modification information to adjust one or more second process apparatuses downstream from the one or more first process apparatuses.

50. The method of clause 49, wherein at least one of the one or more first process apparatuses is upstream from a lithographic apparatus.

51. The method of clause 50, wherein the one or more first process apparatuses comprise a deposition tool.

52. The method of any of clauses 49-51, wherein the one or more second process apparatuses comprise a lithographic apparatus and/or an etch tool.

53. The method of any of clauses 49-52, wherein the one or more contributions of the one or more first process apparatuses to the characteristic comprise a contribution of the deposition tool to the characteristic.

54. The method of clause 53, wherein the contribution of the deposition tool to the characteristic is derived from a characteristic of an etchable layer formed in the substrate by the deposition tool.

55. The method of clause 54, wherein the characteristic of the etchable layer is a thickness of the etchable layer.

56. The method of any of clauses 49-55, wherein the modification information is used to modify a variable of the one or more second process apparatuses.

57. The method of clause 56, wherein the variable comprises a lithography variable of a lithographic apparatus.

58. The method of clauses 56 or clause 57, wherein the variable comprises an etch variable of the etch tool.

59. The method of any of clauses 49-58, wherein the characteristic of the substrate comprises one or more characteristics selected from: critical dimension, critical dimension uniformity, overlay, side wall angle, feature height, bottom surface tilt, pattern shift, and/or geometric asymmetry of a pattern.

60. The method of clause 59, wherein the characteristic of the substrate comprises one or more fingerprints of the characteristic across a pattern on the substrate, or one or more fingerprints of the characteristic across the substrate containing a plurality of the patterns across the substrate.

61. A non-transitory computer program product comprising machine-readable instructions for causing a processor system to cause performance of the method of any of clauses 1-60.

62. A system comprising:
    a hardware processor system; and
    a non-transitory computer readable storage medium configured to store machine-readable instructions, wherein when executed, the machine-readable instructions cause the hardware processor system to perform the method of any of clauses 1-60.

Although specific reference may have been made above to the use of embodiments of the disclosure in the context of optical lithography, it will be appreciated that the disclosure may be used in other applications, for example nanoimprint lithography, and where the context allows, is not limited to optical lithography. In the case of nanoimprint lithography, the patterning device is an imprint template or mold. The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

References herein to crossing or passing a threshold may include something having a value lower than a specific value or lower than or equal to a specific value, something having a value higher than a specific value or higher than or equal to a specific value, something being ranked higher or lower than something else (through e.g., sorting) based on, e.g., a parameter, etc.

References herein to correcting or corrections of an error include eliminating the error or reducing the error to within a tolerance range.

The term "optimizing" and "optimization" as used herein refers to or means adjusting a lithographic apparatus, a patterning process, etc. such that results and/or processes of lithography or patterning processing have more desirable characteristics, such as higher accuracy of projection of a design layout on a substrate, a larger process window, etc. Thus, the term "optimizing" and "optimization" as used herein refers to or means a process that identifies one or more values for one or more variables that provide an improvement, e.g. a local optimum, in at least one relevant metric, compared to an initial set of one or more values for those one or more variables. "Optimum" and other related terms should be construed accordingly. In an embodiment, optimization steps can be applied iteratively to provide further improvements in one or more metrics.

In an optimization process of a system, a figure of merit of the system or process can be represented as a cost function. The optimization process boils down to a process of finding a set of variables (design variables) of the system or process that optimizes (e.g., minimizes or maximizes) the cost function. The cost function can have any suitable form depending on the goal of the optimization. For example, the cost function can be weighted root mean square (RMS) of deviations of certain characteristics (evaluation points) of the system or process with respect to the intended values (e.g., ideal values) of these characteristics; the cost function can also be the maximum of these deviations (i.e., worst deviation). The term "evaluation points" herein should be interpreted broadly to include any characteristics of the system or process. The design variables of the system can be confined to finite ranges and/or be interdependent due to practicalities of implementations of the system or process. In the case of a lithographic apparatus or patterning process, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

While specific embodiments of the disclosure have been described above, it will be appreciated that the disclosure may be practiced otherwise than as described. For example, the disclosure may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the disclosure as described without departing from the scope of the claims set out below.

What is claimed is:

1. A method, comprising:
   determining, by a hardware computer system, a contribution that one or more process apparatuses make to a characteristic of a substrate after the substrate has been processed according to a patterning process by the one or more process apparatuses by removing, from values of the characteristic of the substrate obtained from measurements, a contribution of a lithography apparatus to the characteristic that is obtained from readings or signals of the lithography apparatus or from measurements and a contribution of one or more pre-lithography process apparatuses to the characteristic that is obtained from readings or signals of the one or more pre-lithography process apparatuses or from measurements.

2. The method of claim 1, wherein the one or more process apparatuses comprises an etch tool.

3. The method of claim 1, wherein the contribution of the one or more pre-lithography process apparatuses to the characteristic comprises a contribution of a deposition tool to the characteristic.

4. The method of claim 3, wherein the contribution of the deposition tool is derived from a characteristic of an etchable layer of the substrate formed by the deposition tool.

5. The method of claim 4, wherein the characteristic of the etchable layer is a thickness of the etchable layer.

6. The method of claim 1, wherein the contribution of the lithographic apparatus to the characteristic is derived from a group of one or more variables related to the lithographic apparatus, the one or more variables selected from: one or more variables of illumination by the lithographic apparatus, one or more variables of a projection system of the lithographic apparatus, focus, dose, overlay, a moving standard deviation of movement of a substrate stage of the lithographic apparatus, a moving average of movement of a substrate stage of the lithographic apparatus, laser bandwidth, exposure duration, optical aberration, a high frequency laser bandwidth change, and/or a high frequency laser wavelength change.

7. The method of claim 1, further comprising:
   determining, using the contribution of the one or more process apparatuses, whether the characteristic for one or more substrates under consideration meets or crosses a threshold; and
   responsive to a determination in relation to the threshold, creating and outputting modification information to adjust the one or more pre-lithography process apparatuses, the lithography apparatus, and/or one or more post-lithography process apparatuses.

8. The method of claim 7, wherein the modification information is used to modify a variable of the one or more pre-lithography process apparatuses and the variable comprises a deposition variable of a deposition tool, of the lithography apparatus and the variable comprises a lithography variable of the lithographic apparatus, and/or of the one or more post-lithography process apparatuses and the variable comprises an etch variable of an etch tool.

9. The method of claim 8, wherein the variable comprises the deposition variable of the deposition tool, the deposition variable comprising a deposition rate of the deposition tool or an operating duration of the deposition tool.

10. The method of claim 8, wherein the variable comprises the etch variable of the etch tool, the etch variable comprising an etch type of the etch tool and/or an etch rate of the etch tool.

11. The method of claim 7, wherein the creating modification information comprises creating modification information to adjust a variable of a first component and/or a second component of a post-lithography process apparatus.

12. The method of claim 11, wherein the post-lithography process apparatus is an etch tool, the first component is a first etch chamber of the etch tool, the second component is a second etch chamber of the etch tool, and the variable of the first component and/or the second component comprises an etch rate of the first etch chamber of the etch tool and/or the second etch chamber of the etch tool, an etch type of the first etch chamber of the etch tool and/or the second etch chamber of the etch tool, or an operating temperature of the first etch chamber of the etch tool and/or the second etch chamber of the etch tool.

13. The method of claim 1, wherein the characteristic of the substrate comprises one or more values and/or fingerprints of one or more parameters selected from: critical dimension, critical dimension uniformity, overlay, side wall angle, bottom surface tilt, feature height, pattern shift, and/or geometric asymmetry of a pattern.

14. A method, comprising:
   estimating, by a hardware computer system, a characteristic that will be imparted to a substrate to be processed by a patterning process by combining a contribution specific to the substrate of a first group of one or more process variables related to one or more process apparatuses used in the patterning process, the contribution specific to the substrate obtained from readings or signals of the one or more process apparatuses or from measurements and a contribution non-specific to the substrate of a second group of one or more process variables related to the one or more process apparatuses, the contribution non-specific to the substrate obtained from readings or signals of the one or more process apparatuses or from measurements and at least one process variable from the first group and/or the second group being related to a process apparatus upstream from a lithographic apparatus.

15. A non-transitory computer program product comprising machine-readable instructions therein, the instructions, upon execution by a computer system, are configured to cause the computer system to at least determine a contribution that one or more process apparatuses make to a characteristic of a substrate after the substrate has been processed according to a patterning process by the one or more process apparatuses by removing, from values of the characteristic of the substrate obtained from measurements, a contribution of a lithography apparatus to the characteristic that is obtained from readings or signals of the lithography apparatus or from measurements and a contribution of one or more pre-lithography process apparatuses to the characteristic that is obtained from readings or signals of the one or more pre-lithography process apparatuses or from measurements.

16. A system comprising:
a hardware processor system; and
the non-transitory computer readable storage medium of claim 15.

17. A method, comprising:
determining one or more contributions of one or more first process apparatuses to a characteristic of a substrate, the one or more contributions obtained from readings or signals of the one or more first process apparatuses or from measurements; and
creating, by a computer hardware system and based at least in part on the one or more contributions, modification information to adjust one or more second process apparatuses downstream from the one or more first process apparatuses.

18. The method of claim 17, wherein at least one of the one or more first process apparatuses is upstream from a lithographic apparatus.

19. The method of claim 18, wherein the one or more first process apparatuses comprise a deposition tool.

20. The method of claim 17, wherein the one or more second process apparatuses comprise a lithographic apparatus and/or an etch tool.

21. A non-transitory computer program product comprising machine-readable instructions, that upon execution by a computer system, are configured to cause the computer system to at least estimate a characteristic that will be imparted to a substrate to be processed by a patterning process by combining a contribution specific to the substrate of a first group of one or more process variables related to one or more process apparatuses used in the patterning process, the contribution specific to the substrate obtained from readings or signals of the one or more process apparatuses or from measurements and a contribution non-specific to the substrate of a second group of one or more process variables related to the one or more process apparatuses, the contribution non-specific to the substrate obtained from readings or signals of the one or more process apparatuses or from measurements and at least one process variable from the first group and/or the second group being related to a process apparatus upstream from a lithographic apparatus.

22. A non-transitory computer program product comprising machine-readable instructions, that upon execution by a computer system, are configured to cause the computer system to at least:
determine one or more contributions of one or more first process apparatuses to a characteristic of a substrate, the one or more contributions obtained from readings or signals of the one or more first process apparatuses or from measurements; and
create, based at least in part on the one or more contributions, modification information to adjust one or more second process apparatuses downstream from the one or more first process apparatuses.

* * * * *